United States Patent [19]

Tanaka et al.

[11] 4,329,539
[45] May 11, 1982

[54] SUPERCONDUCTING COMPOUND STRANDED CABLE

[75] Inventors: Yasuzo Tanaka, Yokohama; Yoshio Furuto, Higashi, both of Japan

[73] Assignee: The Furukawa Electric Co., Ltd., Tokyo, Japan

[21] Appl. No.: 8,263

[22] Filed: Feb. 1, 1979

Related U.S. Application Data

[63] Continuation of Ser. No. 746,250, Dec. 1, 1976, abandoned.

[30] Foreign Application Priority Data

| Dec. 3, 1975 | [JP] | Japan | 50-142889 |
| Dec. 18, 1975 | [JP] | Japan | 50-150976 |
| Feb. 10, 1976 | [JP] | Japan | 51-13535 |
| Apr. 10, 1976 | [JP] | Japan | 51-40601 |
| Apr. 28, 1976 | [JP] | Japan | 51-49058 |
| May 14, 1976 | [JP] | Japan | 51-54965 |

[51] Int. Cl.³ .................................. H01B 12/00
[52] U.S. Cl. .......................... 174/128 S; 174/15 S; 174/126 S
[58] Field of Search ............ 174/126 S, 128 S, 15 S

[56] References Cited

U.S. PATENT DOCUMENTS 3,619,479 11/1971 Bogner .................... 174/126 R
3,983,521 9/1976 Furato ......................... 335/216

OTHER PUBLICATIONS

Critchlow et al., "Multifilamentary Super Conducting Composites in Cryogenics", 2/71, pp. 3–9.
Frascati "Fifth Int. Conf. on Magnet Technology", 7/75 Published by Lab. Nazionali Del Chen, pp. 320–331.
IEEE Transactions on Magnetics, 3/75, vol. Mag. 11 #2, 1974, pp. 328–330.

Primary Examiner—Elliot A. Goldberg
Attorney, Agent, or Firm—Toren, McGeady & Stanger

[57] ABSTRACT

A superconducting compound cable which comprises a plurality of strands each having therein at least one filament of a superconducting compound material in the lengthwise direction of the strand, said strands being of an elliptical or flat shape in cross section, arranged in layers and stranded at a predetermined pitch in the axial direction of the cable, and the total cross-sectional area of all the strands in the cable being more than 50 percent of that of the rectangle or trapezoid circumscribed about the periphery in a cross section of the cable.

15 Claims, 49 Drawing Figures

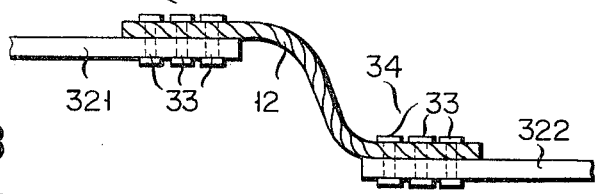
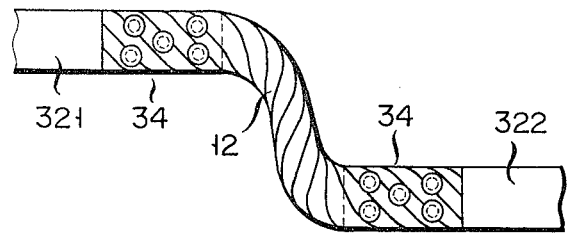
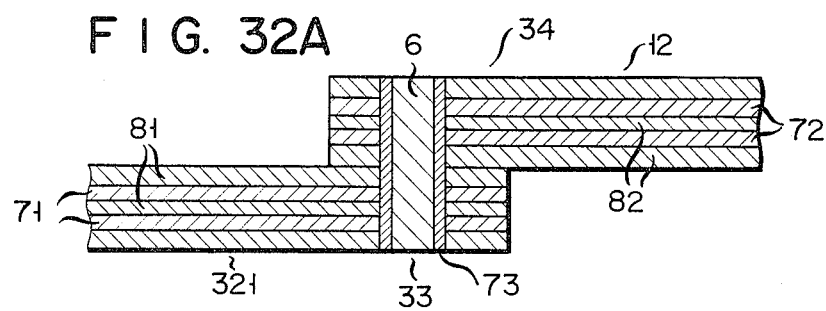
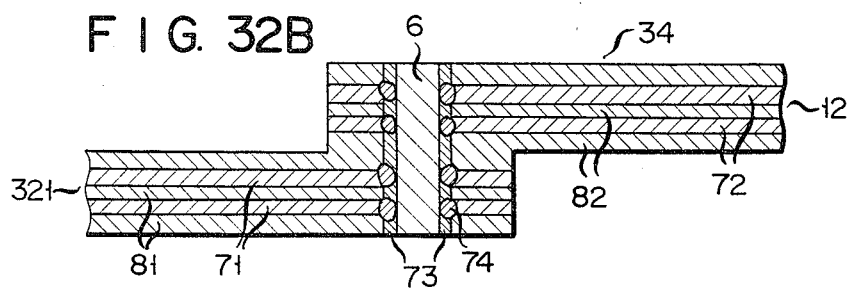
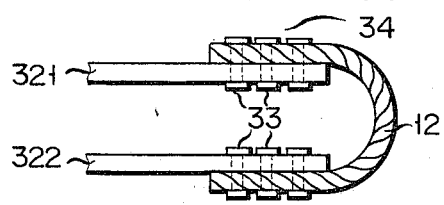
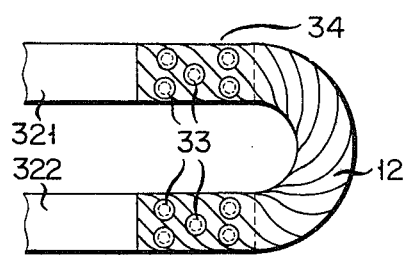
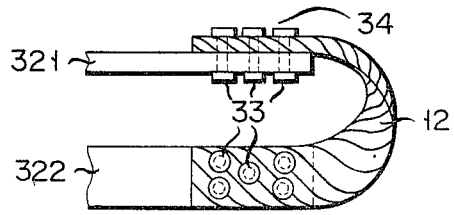
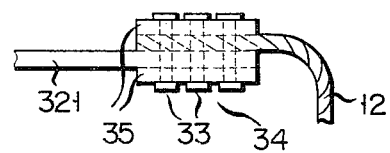

SUPERCONDUCTING COMPOUND STRANDED CABLE

This is a continuation of application Ser. No. 746,250 filed on Dec. 1, 1976 now abandoned.

This invention relates to a superconducting compound cable of compacted twisted strands, each having a plurality of fine cores (hereinafter referred to as "a fine multicore stranded superconducting cable"), the cable having high flexibility, stability and mechanical strength.

The following requisites are generated demanded of a superconducting compound wire and cable.
(1) To have prominent flexibility
(2) To display little anisotropic property
(3) To have high current density
(4) To be composed of a large number of fine cores
(5) To be little subject to A.C. loss
(6) To have great mechanical strength
(7) To be protected from quench damage Superconducting compounds include a $\beta$-W(A-15) type consisting of, for example, $Nb_3Sn$, $V_3Ga$; a NaCl (B-1) type consisting of, for example, NbN, ZrN; and a Laves (C-15) type consisting of, for example, $V_2Zr$, $V_2Hf$. Among these types, compounds of $Nb_3Sn$ and $V_3Ga$ along have been put to practical use. The above-listed superconducting compounds more prominently displayed fundamental properties, for example, characteristics of critical temperature, critical magnetic field, and critical current density than other superconducting materials such as alloys of Nb-Ti or Nb-Zr and were deemed hopeful for use in a high magnetic field, but had the disadvantage of having weak resistance to mechanical stresses such as flexures or shocks. A tape-like conductor illustrated in FIG. 1 was developed to provide a cable structure capable of overcoming the above-mentioned brittleness to mechanical stresses. A tape-like superconducting compound conductor proposed had, for example, such a structure that as seen from FIG. 1, a superconducting layer 2 of $Nb_3Sn$ was provided around a Nb tape 1; a stabilizing layer 3 of copper or alloy thereof was formed around said superconducting layer 2 with an ordinary soldered layer 4 disposed between said superconducting layer 2 and stabilizing layer 3; and an outermost insulating layer 5 was applied around said stabilizing layer 3. Though displaying excellent flexibility in the direction of one dimension, that is, flatwise, yet the proposed tape-like superconducting compound conductor had the drawbacks that the tape indicated instability such as a flux jump arising from an ununiform magnetic field caused by geometric anisotropic property; and uneven current density and in consequence ununiform magnetic field always raised problems in designing a magnet.

Later, superconducting compound conductors shown in FIGS. 2 and 3 were proposed in succession. Reference is first made to a $V_3Ga$ fine multicore stranded superconducting cable of FIG. 2. This cable is formed by first providing a plurality of V cores 6 into a Cu-Ga alloy 8 as a matrix, thereby to provide strands 9, stranding said six strands 9 around a reinforcing member 13, forming an superconducting layer 7 of $V_3Ga$ around said V cores 6 by diffusion reaction between the Cu-Ga matrix 8 and V cores 6, and coating stabilizing material 11 all around the strands 9. There will now be described tape-like another $Nb_3Sn$ fine multicore stranded superconducting cable of FIG. 3. This cable is formed by first providing a plurality of Nb cores 6 into a Cu-Sn alloy 8 as a matrix, twisting the assembly in its lengthwise direction, shaping the assembled mass into a tape with rolls, and forming a superconducting layer 7 of $Nb_3Sn$ around the Nb cores 6 by diffusion reaction between the Cu-Sn matrix 8 and Nb cores 6.

The fine multicore stranded superconducting cable of FIG. 2 eliminates the anisotropic property of the tape-like conductor of FIG. 1 and presents prominent flexibility in all crosswise directions of the conductor, but fails to provide sufficient current density due to the presence of 20 to 50% void spaces in the cable. Moreover, the cable of FIG. 2 is subject to a local stress at the crosses of said cables with the resultant damages of superconducting compound.

The tape-like superconducting cable of FIG. 3 is very flexible in one direction (flat wise) of the conductor and has such a structure as relatively increases current capacity. Where, however, a magnetic field is applied to the cable of FIG. 3, then 20 to 40% current anisotropy arises according to the direction in which said magnetic field is applied, presenting difficulties in designing a superconducting magnet or operating such magnet. Further, when used for a large capacity, the cable of FIG. 3 in which a superconducting compound is embeded in a metal matrix presents the drawbacks that eddy current loss or skin effect becomes noticeable under the condition in which pulses or high frequency is used.

The present inventors have made various studies in view of the above-mentioned drawbacks accompanying the prior art superconducting cables and, as a result, found a fine multicore stranded superconducting cable which has an excellent flexibility, is free from current anisotropy and admits of high current density and large current capacity, thereby fully meeting all the above-mentioned seven requirements.

This invention provides a flat and rectangular fine multicore stranded superconducting cable comprising a plurality of strands having continuous superconducting compound phase, in which each strand has a round or flat shape in cross section; the respective strands are arranged in layers and transposed at a predetermined pitch in the axial direction of the cable; and the total cross-sectional area of all the strands in the cable accounts for more than 50% of that of the rectangle or trapezoid circumscribed about the periphery in the cross section of the cable. Particularly, according to this invention, the strand is twisted at a pitch of 2 to 200 times the outer diameter of said strand. A cable itself comprises a plurality of said strands is stranded at a stranding pitch P of 2 to 20 times the width W of the cable. The ratio of the width W of the cross section of the cable to the thickness t thereof is 1 to 100. Where the cable cross section has a thickness $t_0$ satisfying the following relationship then there is obtained a most ideal stranded superconducting cable.

$$t_0 \gtrsim 2R_0 \times \epsilon_0 \times (1 + 4W^2/P^2)$$

where:

$R_0$ = allowable bending radius of the cable. $R_0$ is a minimum bending radius which allows the superconducting compound of the cable to be bent without damage, namely a curvature radius defined by a neutral interface positioned at a point corresponding to half the thickness or average thickness of the cable in cross section. In other words, the term "neutral interface", as used herein, is defined to mean the portion in which the cable, when bent, does not present any elongation or constriction. The term $\epsilon_0$ given in the above relationship is an upper strain limit (hereinafter referred to as "an allowable strain") within which the superconducting material does not degrade and superconducting characteristics, e.g., no damage occurs to the continuous phase of the superconducting compound material in the strand. Where, therefore, subjected to a larger strain than $\epsilon_0$, the superconducting compound material presents cracks and loses its superconducting property. While varying with, for example, the kind of superconducting compound, $\epsilon_0$ is generally taken to be 0.2 to 0.6%. W is the width of the cable and P is its stranding pitch.

Unlike the prior art tape-like superconducting compound cable, the cable of this invention can be bent in two directions, that is, flat wise and edge wise. What is important is that with the superconducting compound cable of this invention, the thickness $t_0$ and width W, stranding pitch P, allowable bending radius $R_0$ and allowable strain $\epsilon_0$ of the superconducting compound are so chosen as to satsify the above relationship $t_0 = 2R_0 \times \epsilon_0 \times (1 + 4W^2/P^2)$ and, though formed of a very brittle superconducting compound, the cable of this invention can be handled in the same manner as a metal alloy superconducting cable when taken up on a drum or formed into a magnet coil. The aforesaid allowable bending radius $R_0$ is a bending limit namely a minimum bending radius over which the superconducting compound cable of this invention can be bent to the same extent as the metal alloy superconducting cable without losing a superconducting property. With R taken to denote the bending radius with which a cable is bent under a customary condition of application, $R_0$ should always be chosen to be $R_0 \leq R$. Further, with t taken to represent the thickness of the cable as previously described, the thickness $t_0$ of a most ideal superconducting compound cable should always be chosen to be $t_0 \leq t$. Therefore, said thickness $t_0$ can be easily determined from the aforesaid relationship according to the desired bending radius R, width W and stranding pitch P of the cable. A superconducting compound cable in which t, W, P are set at specified values can have the allowable bending radius $R_0$ determined from the previous described relationship eliminating the necessity of providing a large scale expensive apparatus for measurement of $R_0$.

This invention will be more fully understood by reference to the appended drawings in which.

Figure 6A:
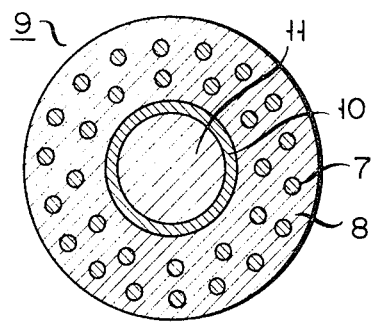
Figure 6B:
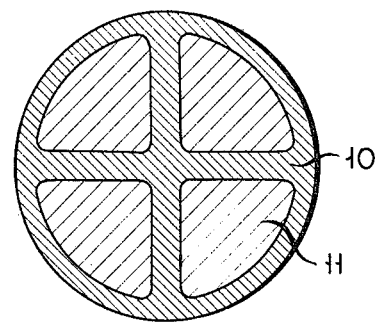
Figure 7:
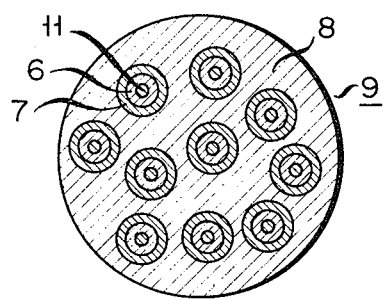
Figure 8:
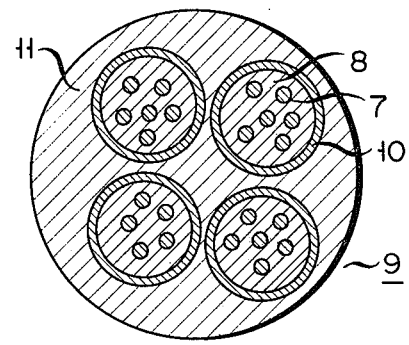
Figure 9:
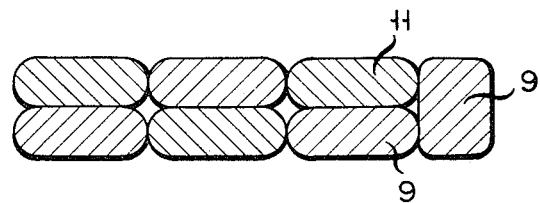
Figure 10:
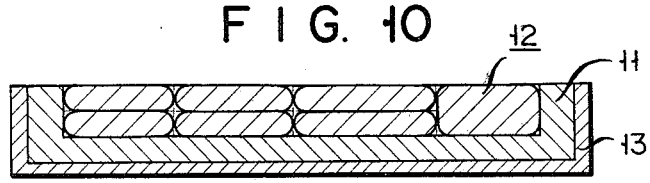
Figure 11:
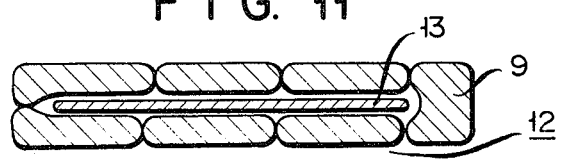
Figure 12A:
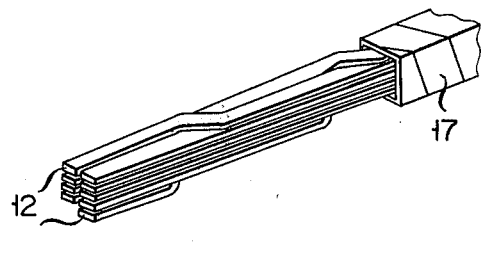
Figure 12B:
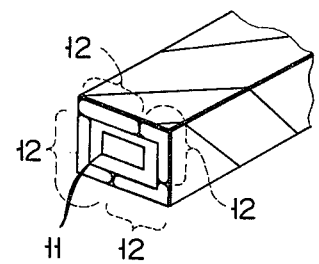
Figure 12C:
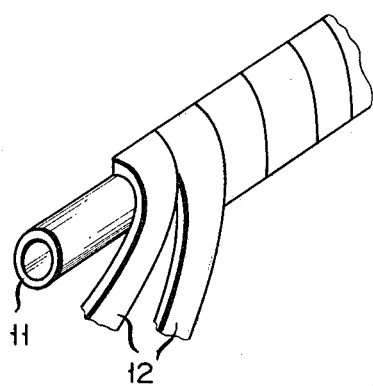
Figure 13:
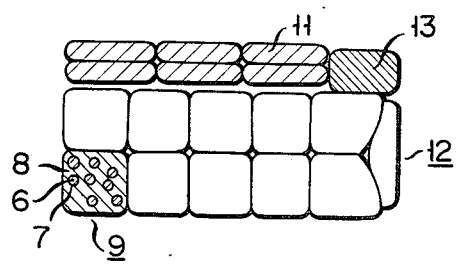
Figure 14:
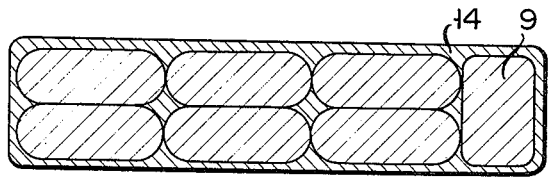
Figure 15:
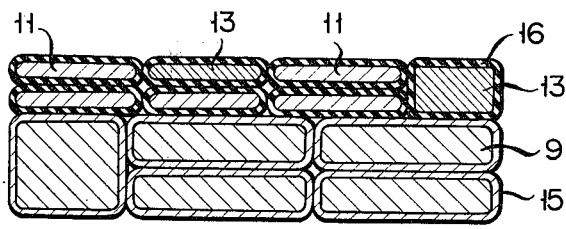
Figure 16:
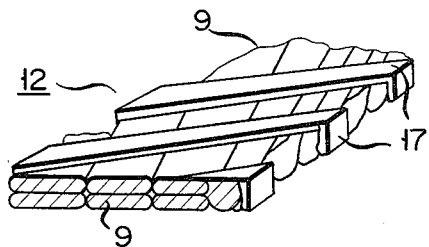
Figure 17A:
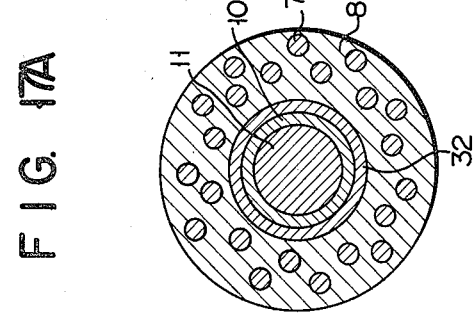
Figure 17B:
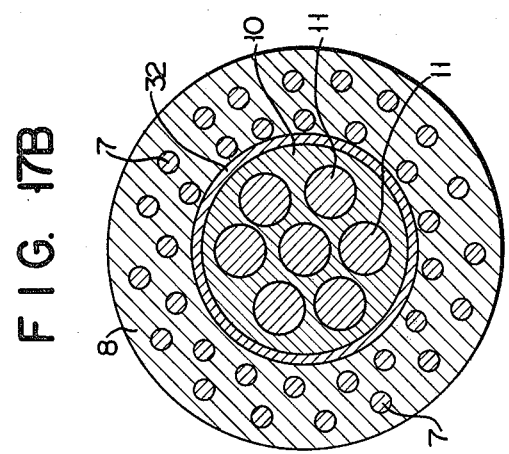
Figure 17C:
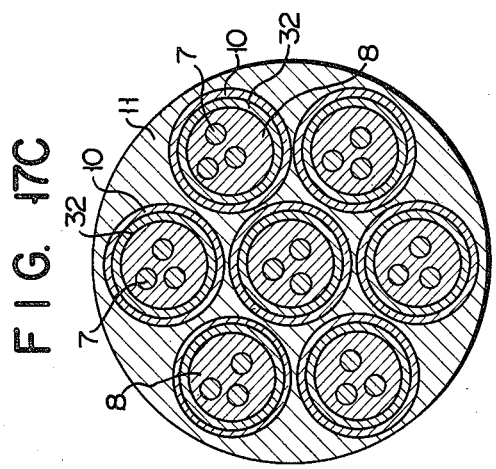
Figure 18:
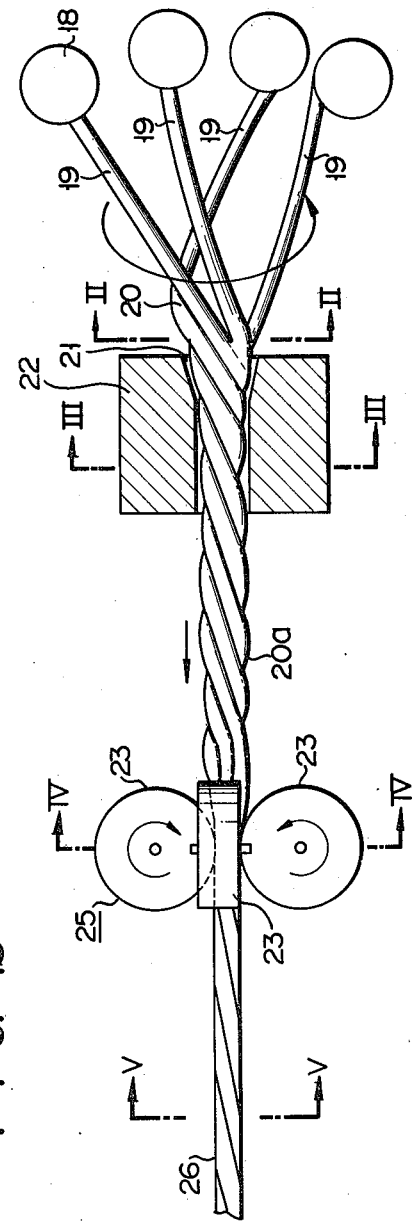
Figure 19:
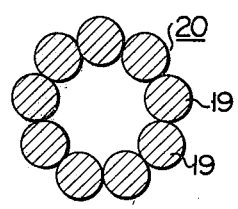
Figure 20:
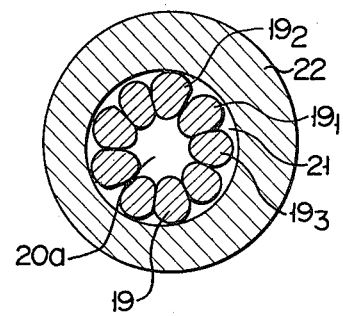
Figure 21:
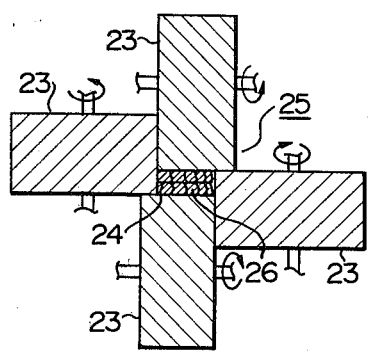
Figure 22:
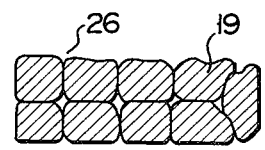
Figure 23:
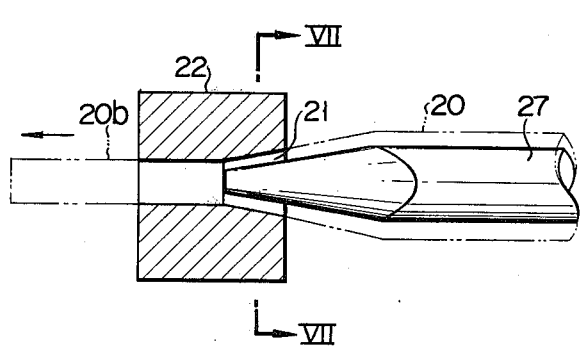
Figure 24:
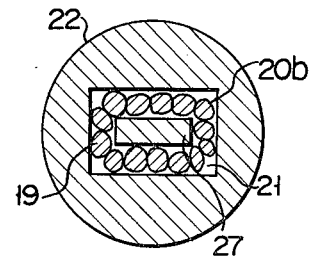
Figure 25:
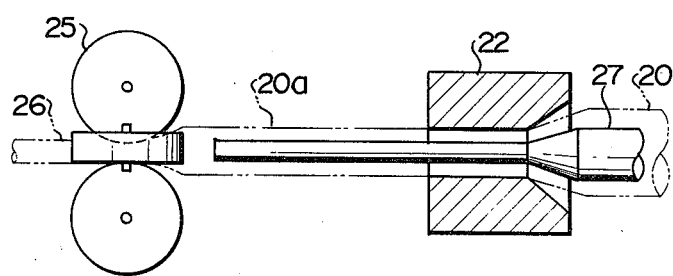
Figure 26:
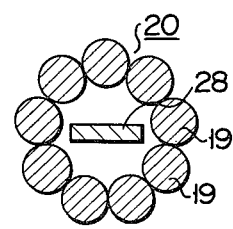
Figure 27:
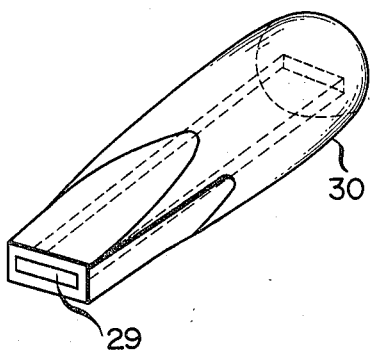
Figure 28:
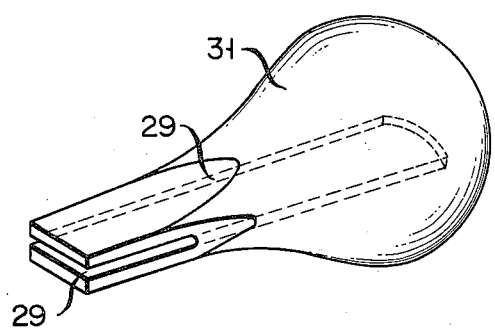
Figure 29:
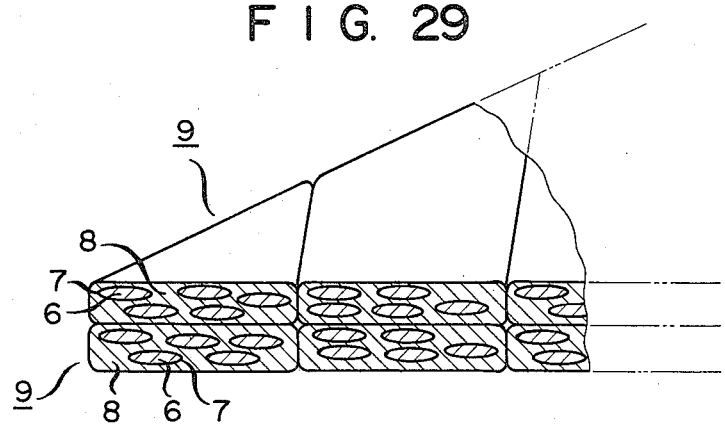
Figure 30:
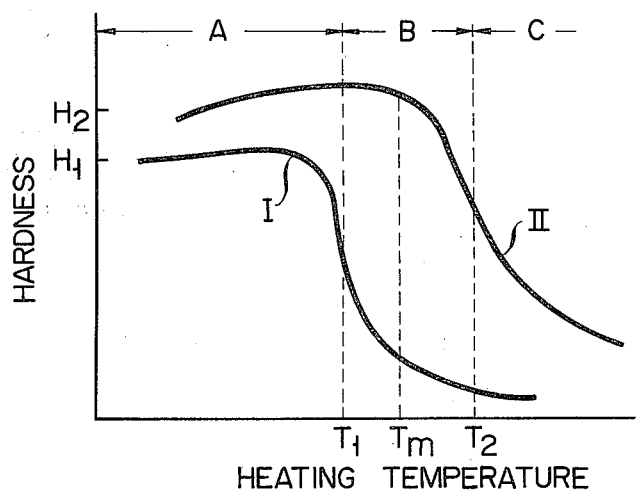
Figure 34:
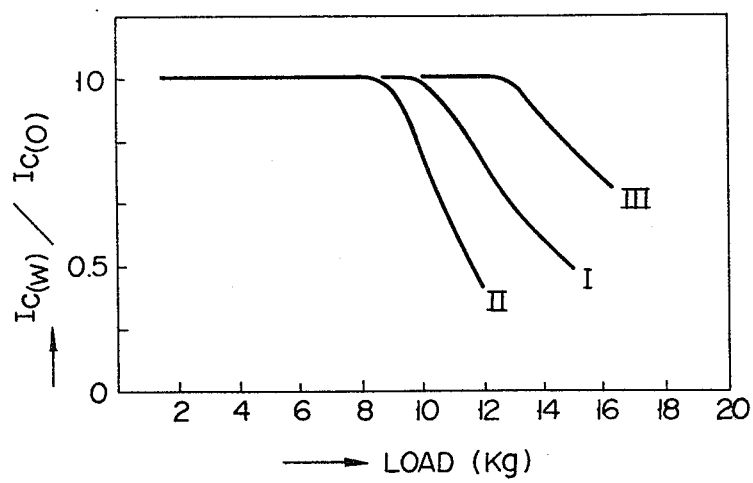

FIGS. 6A, 6B and 7 indicate the cross section of the strands containing stabilizing material in the cable of this invention;

FIG. 8 shows the cross section of the strand in which superconducting compounds are embedded in a stabilizing material in the cable of this invention;

FIG. 9 presents the cross section of the stranded cable, some of which is substituted by a stabilizing and/or reinforcing material in the cable of this invention;

FIG. 10 illustrates the cross section of the superconducting compound cable embedded in a stabilizing and/or reinforcing material in this invention;

FIG. 11 indicates the cross section of the superconducting compound cable of this invention, into the central part of which a reinforcing material is inserted;

FIG. 12A sets forth a transposed cable formed by assembling the cables of this invention using as secondary strands;

FIGS. 12B and 12C show hollow cables formed by the same assembling as in FIG. 12A;

FIG. 13 illustrates the cross section of the superconducting compound stranded cable assembled with a stabilizing and/or reinforcing material according to this invention;

FIG. 14 indicates the cross section of the cable filled and covered with a soft metal, according to this invention;

FIG. 15 shows the cross section of the strands of the superconducting compound stranded cable of this invention which are surrounded with material of high electric resistance;

FIG. 16 presents the superconducting compound stranded cable of the invention tape lapped or braided with insulated reinforcing and stabilizing materials in the form of a tape or a strand;

FIGS. 17A, 17B and 17C are the cross sections of the strands of the superconducting compound stranded cable of this invention containing a stabilizing material before said compound is formed by diffusion reaction;

FIG. 18 shows a flow line for manufacturing the superconducting compound stranded cable of this invention;

FIG. 19 is a cross sectional view on line II—II of FIG. 18;

FIG. 20 is a cross sectional view on line III—III of FIG. 18 (die portion);

FIG. 21 is a cross sectional view on line IV—IV of FIG. 18 (Turk's-head portion);

FIG. 22 is a cross sectional view on line V—V of FIG. 18 (cross section of the cable);

FIG. 23 shows an embodiment for manufacturing the cable of this invention by using mandrels;

FIG. 24 is a cross sectional view on line VII—VII of FIG. 23;

FIG. 25 indicates another embodiment for manufacturing the cable of this invention by using mandrels;

FIG. 26 is a cross sectional view of the assembled strands of the superconducting compound stranded cable of the invention containing a reinforcing material in the central portion thereby;

FIG. 27 shows a slitted mandrel used in this invention;

FIG. 28 indicates a slitted floating plug used in this invention;

FIG. 29 is a cross sectional view of a cable manufactured by using the working temperature in the range of C indicated in FIG. 30;

FIG. 30 presents the range of working temperature in the method for manufacturing a superconducting compound stranded cable of this invention;

FIG. 31A is a side elevation of the joint formed by using the superconducting compound stranded cables of this invention;

FIG. 31B is a plan view of the joint of FIG. 31A;

FIG. 32A is a cross section of the mechanical connection portion in the joint indicated in FIGS. 31A and 31B;

FIG. 32B is a cross section of the connection portion of FIG. 32A completed by diffusion;

FIGS. 33A to 33C are modifications of the above-mentioned joint effected in different directions;

FIG. 33D shows said joint provided with sleeves;

FIG. 34 sets forth the results of Example 7; and

Figure 35:
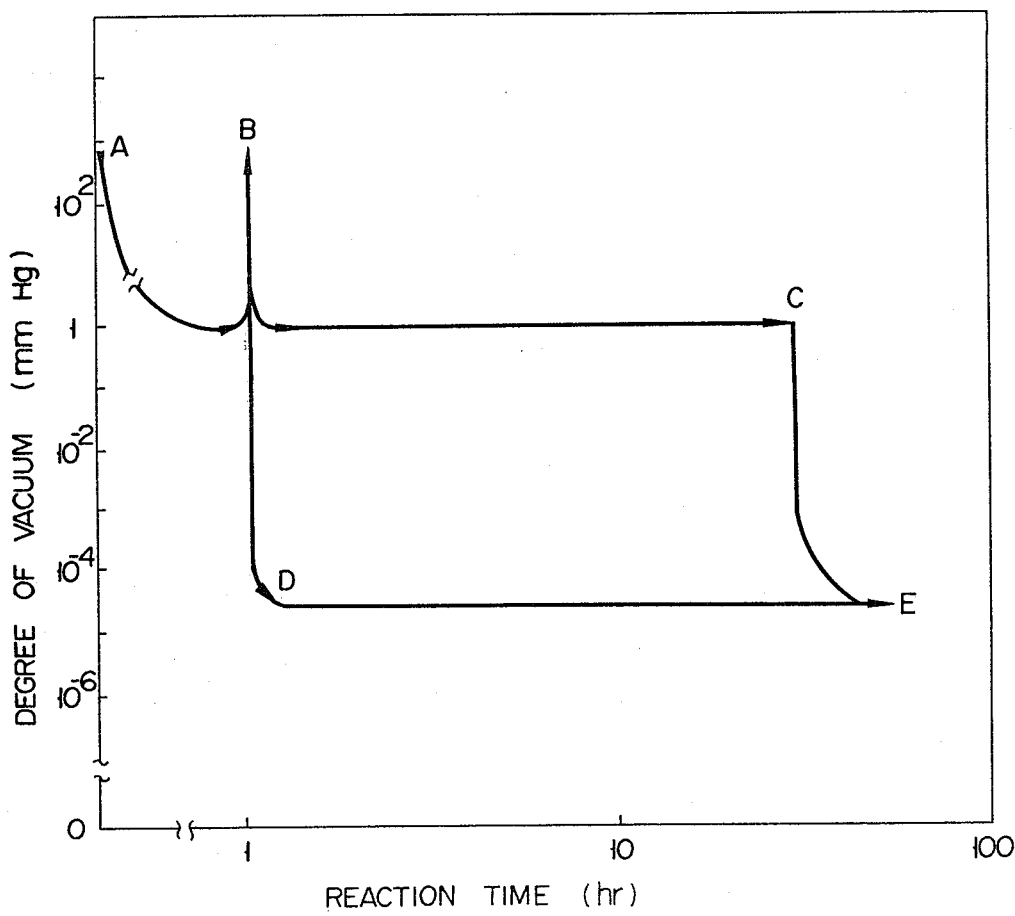

FIG. 35 shows the conditions in which the experiments of Example 9 were carried out.

There will now be described by reference to the appended drawings the fundamental structure of a superconducting compound cable according to this invention with Mb$_3$Sn taken to be a typical superconducting compound. Obviously, this invention is not limited thereto.

Figure 1:
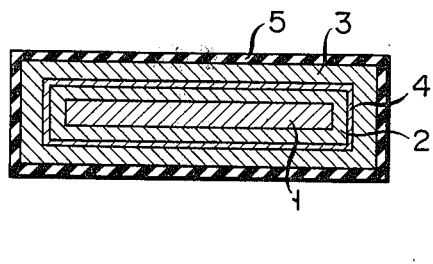
FIG. 1 is a prior art tape-like superconducting compound cable.
Figure 3:
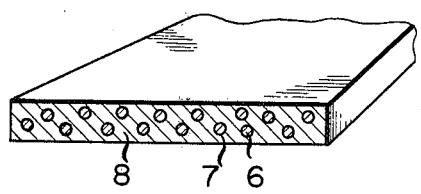
FIG. 3 is a prior art tape-like superconducting compound cable containing a plurality of fine cores.
Figure 4A:
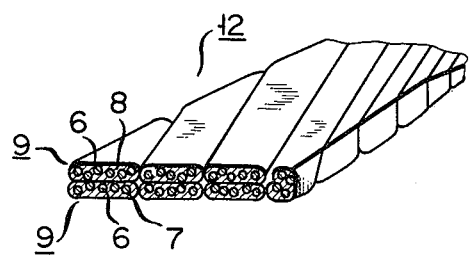
FIG. 4A is the oblique view of a stranded superconducting compound cable according to this invention.

Referring to FIG. 4A, a fine multi core stranded superconducting compound cable embodying this invention fundamentally comprises two upper and lower layers (as shown in the cross section of said cable) of a plurality of strands 9, each containing a continuous phase of a superconducting compound 7 of Nb$_3$Sn. In the case of FIG. 4A, the respective strands 9 have a race track shaped (elliptical or oval) or flattened cross section. These strands 9 arranged in two upper and lower layers have their positions periodically transposed. The total cross sectional area of seven strands 9 included in the cross section of the superconducting compound cable shown in FIG. 4B should be larger than 50% of an area of rectangle or trapezoid K circumscribed about said seven strands 9, this being hereinafter referred to as "a strand-packing factor". The reason for setting said factor within the range of more than 50% is that with a cable containing three strands each having a simplest circular cross section, the above-set strand-packing factor indicates approximately 50%; an increased number of strands and enlargement of compacting rate (attained by flattening the strands or shaping them into a rectangular form) lead to the elevation of the strand-packing factor; and absence of any free space between the strands realizes a 100% strand-packing factor. The larger the strand-packing factor, the higher the current density of a superconducting compound cable. The superconducting compound cable of this invention may have an odd or even number of strands. However, the strands are preferred to have an odd number in order to prevent the strands from intersecting each other at many overlapping points due to their transposed positions and also to avoid the cutting of core resulting from the constriction of the strands at both edges of their cross sections. Further, a continuous phase of each superconducting compound core 7 included in the strand 9 should have such cross section that the ratio of the minor axis to the major axis is 1:1 to 1:2. The reason for setting the ratio within the above-mentioned range is that where a magnetic field is applied to the superconducting compound cable, then a value of critical current varies according as whether said magnetic field is applied in the direction of the minor or major axis in the cross section of the superconducting compound core 7. The presence of said current anisotropy makes it impossible to produce a high current density or a large current capacity in proportion to the effective cross sectional area of the superconducting compound 7. With a tape-like single core cable shown in FIG. 1, said current anisotropy becomes 50 to 70%. In contrast, with a tape-like multicore cable of FIG. 3 manufactured by the conventional process, the ratio of the minor axis to the major axis is 1:2 or over, causing the current anisotropy to be to 20 to 40%. Therefore, a superconducting compound cable containing a plurality of very fine cores should be the type in which the ratio of the minor axis of the cross section of the superconducting compound 7 to the major axis of said cross section is 1:1 to 1:2.

With the superconducting compound cable of this invention, the cores of said cable should intersect each other in the three-dimensional form relative to the lengthwise direction of the cable in order to cut coupling current resulting from changes in a magnetic field when said superconducting compound is put into operation. As later described, the strand 9 includes a single core type and a multicore type. From the standpoint of stability, however, the multicore type containing a very fine cores is preferred. Moreover, the strands should be twisted together at a pitch 2 to 200 times the outer diameter thereof. The reason for defining the pitch within the above-mentioned range is that the superconducting core compound need not be inclined at a larger angle than 45° (corresponding to a pitch two times the outer diameter of the strand 9) relative to the lengthwise direction of the cable; and that if the core is twisted at least once for each circumferential length of a practical coil, then the object is fully attained. Limitation is imposed on a stranding pitch at which the superconducting compound cable of this invention is stranded in order to improve the flexibility of the cable. Said pitch is preferred to be 2 to 20 times the width W (FIG. 4B) of the cable. The reason is that said pitch should be limited in order to effectively cut coupling current, to prevent the deformation of the cable when it is wound to provide a magnet coil and to minimize a difference between the degrees of flexibility of the cable in both directions of the thickness (flat wise) and width (edge wise) of the cable.

The superconducting compound cable of this invention which is essentially formed of a superconducting compound is manufactured, as naturally expected, in consideration of the intrinsic mechanical brittleness of said compound. If the ratio of the width W of the cross section of the cable to the thickness t thereof (W/t in FIG. 4B) is chosen to fall within the range between 1 to 100, then the flexibility of the cable can be obtained depending on requirements. When the cable is bent in two directions of the thickness and width with a substantially equal rate, then the ratio of W/t is most preferred to be 1. Where the cable is only bent in the direction of the thickness that is, flat wise, then a smaller W/t ratio than 100, or preferably 50 well serves the purpose of preventing the deformation of the cable. As previously described, the thickness t of the cable should be selected within the range expressed by the following formula:

$$t \leq t_0 = 2R_0 \times \epsilon_0 \times (1 + 4W^2/P^2)$$

Figure 4B:
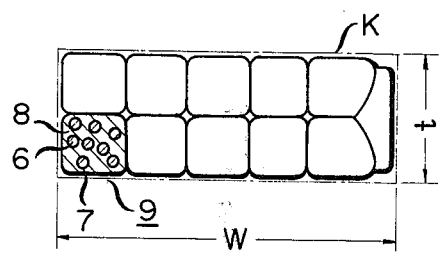
FIG. 4B is the rectangular cross section of the cable of FIG. 4A.
Figure 4C:
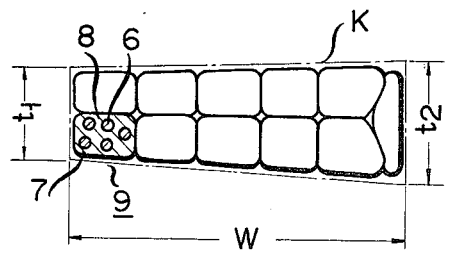
FIG. 4C is the trapezoidal cross section of the cable of another embodiment according to the invention.

The cross section of the fundamental structure of the superconducting compound cable of this invention is not limited to those which are shown in FIGS. 4A and 4B but may have a trapezoidal or key stone form illustrated in FIG. 4C. The cable of this shape is most adapted to be used as the winding of a bipolar magnet for acceleration of electron beams as well as of special form coils used with 4-pole magnets. The character t given in the W/t ratio denotes an arithmetic mean of two kinds of thickness $t_1$, $t_2$ ($t=(t_1+t_2)/2$). The neutral interface of the cable is defined to mean a plane corresponding to half said mean thickness t.

Figure 2:
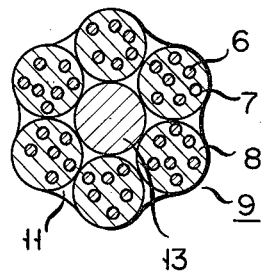
FIG. 2 is a prior art fine core stranded superconducting compound cable.

No particular limitation is imposed on the structure of a strand of a superconducting compound cable according to this invention. Formation of very brittle superconducting compounds in a strand is effected by stranding said strands together, for example, rolling the stranded assembly into a flat angular or simply flattened shaped and thereafter heating it to make compound in each strand. Before the abovementioned rolling is carried out, namely, before a superconducting compound is fully formed, the starting strand may have a circular cross section, or such a cross section as is presented by a plurality of strands stranded together as shown in FIG. 2.

For convenience, there will now be described the internal structure of a strand by reference to a type having a circular cross section. FIGS. 5 to 8 show the typical examples of the internal structure of a strand used in a superconducting compound cable of this invention. Obviously, the internal structure of said strand is not limited to those illustrated in FIGS. 5 to 8.

Figure 5A:
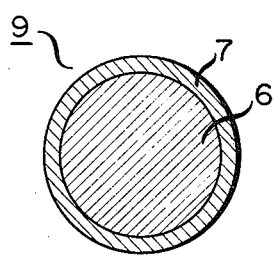
FIGS. 5A to 5C show the cross section of the strands containing no stabilizing material in the cable of this invention.
Figure 5B:
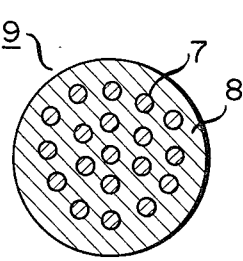
Figure 5C:
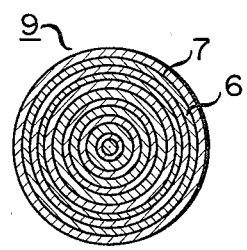

The strand generally has such fundamental structures as shown in FIGS. 5A, 5B and 5C. In FIG. 5A, a $Nb_3Sn$ phase 7 is formed around a Nb phase 6. In FIG. 5B, a large number of $Nb_3Sn$ phases 7 are contained in a Cu-Sn alloy matrix 8. In FIG. 5C, Nb and $Nb_3Sn$ phases are alternately arranged. The modifications (FIGS. 6 to 8) of said fundamental structures of the strand contain a stabilizing metal member.

There will now be described by reference to FIGS. 6 to 8 the structure of a superconducting compound cable provided with said stabilizing member. In FIG. 6A, a plurality of $Nb_3Sn$ phases 7 are included in a Cu-Sn alloy matrix 8, and a stabilizing material 11 is also contained in a state surrounded by a barrier 10. In FIG. 6B, the stabilizing material 11 is divided into a plurality of sections by the barrier 10. The stabilizing materials 11 is preferred to be the type such as copper, gold, silver or aluminum which, even when used at extremely low temperature, displays good electric and thermal conductivity and a little effect of magnetic resistance. The barrier 10 should be so constructed as to effectively prevent the stabilizing metal material 11 from decreasing in purity during diffusion heat treatment for formation of the superconducting compound 7. Therefore, the barrier 10 should be the type which can suppress mutual diffusion between the stabilizing metal material 11 and other metal materials contained in the strand 9. To this end, the barrier 10 is selected from the group consisting of, for example, tantalum, niobium and vanadium according to the kinds of other metal materials contained in the strand 9. The strand may have a structure shown in FIG. 7 in which the stabilizing metal material 11 of the strand 9 is surrounded by unreacted metal 6 (Nb in the case of $Nb_3Sn$) in the superconducting compound 7. Or the strand may have a structure illustrated in FIG. 8 in which a plurality of composite bodies each consisting of a plurality of superconducting compounds 7, a matrix 8 of an alloy of one of the constituent metal elements of said superconducting compound 7 and a barrier 10 are surrounded by a stabilizing metal material 11.

There will now be described some modifications of the fundamental structure of the superconducting compound cable 12 of this invention. The cable 12 may have such a modified structure as shown in FIG. 9 in which a desired number of the superconducting strands 9 shown in FIG. 4 are replaced by stabilizing metal members 11. This modified structure is characterized in that the superconducting compound cable of this invention can be provided with a stabilizing metal material 11 without changing the flexibility of the cable 12 at all. The cable 12 may have another modified structure (FIG. 10), in which part or the whole of the cable 12 of the invention is embedded in a stabilizing material 11 and/or a reinforcing material 13. The cable 12 may have still another modified structure (FIG. 11), in which a reinforcing material 13 extending lengthwise of the cable 12 is disposed in the central portion of the cross section of the cable 12 constructed as shown in FIG. 4.

Further, this invention includes a composite cable (FIGS. 12A, 12B and 12C) consisting of a plurality of cables 12 having structures shown in FIGS. 4, 9, 10 and 11 and acting as secondary strands, which are assembled into a desired structure. FIG. 12A shows a transposed cable formed by assembling a plurality of cables 12 acting as secondary strands into a flat and rectangular cable assembly with the positions of the respective constituent cables 12 transposed and winding an electrically insulated stainless steel tape 17 around said cable assembly. FIGS. 12B shows a hollow rectangular tubular composite cable formed by winding constituent cables 12 around a rectangular pipe made of a stabilizing material 11 and/or a reinforcing material. FIG. 12C presents a hollow round tubular composite cable formed by winding constituent cables 12 around a round pipe made of a stabilizing material 11 and/or a reinforcing material.

There will now be described the superconducting compound cable of this invention whose fundamental structure is further provided with a stabilizing and/or a reinforcing material. Depending on the conditions of application, the cable is further demanded to have greater stability and mechanical strength. Though most adapted for use in a strong magnetic field, the superconducting compound having an intrinsically small mechanical strength should be supported by fully effective stabilizing and reinforcing materials when demanded for carrying large current in a strong magnetic field. Moreover, addition of such additive materials should not lead to a failure in the flexibility of a superconducting compound cable. This object is attained by applying a structure shown, for example, in FIG. 13 in addition to those already described. The structure particularly of FIG. 13 may be regarded as a fundamental structure most adapted for use in a cable of large current capacity. In principle, either one or both wide faces of the tape-like cable of FIG. 4 are fitted with either or both of stabilizing metal materials 11 and reinforcing materials 13 (tungsten, molybdenum, stainless steel, carbon, boron). In case both of said additive materials are applied, proportions thereof are defined according to the object intended. Said additive materials effectively serve the purpose if they have a tapelike shape (including a laminated tape) or take the form of compacted stranded strands fully flexible flat wise and edge wise.

There will now be described the structure of a superconducting compound cable according to this invention which is adapted for D.C. application.

Consideration regarding the stability of the present cable has been mainly directed to provision of a large number of fine superconducting compound cores, twisting of said fine cores and addition of a stabilizing metal material. Since theoretical studies on these respects have been considerably advanced, it is possible to judge the stability of said cable in terms of quantity and carry out a design adapted for said judgment. In fact, however, unstable conditions of the cable such as flux jumps arise from other factors in addition to those mentioned above. Said unstable conditions are ascribed to heat buildup accompanying local vibrations and displacements of conductors included in the cable which are caused by application of an electromagnetic force. Therefore, even when intended for D.C. application, the strands and cores should be fixed in place as securely as possible. If, therefore, a void space of 50% at maximum occurs, the cable of this invention will be unadapted for practical application. Such void space presents difficulties not only in heat transfer but also in bypassing current arising during transfer from super to normal conductivity in the conductors. Accordingly, it is preferred that said void space be filled with soft metals such as indium, tin and lead or electrically insulating material (mainly to the strands in position) which are little liable to harm the flexibility of the conductors. FIG. 14 shows the structure of the superconducting compound cable of this invention in which a soft metal material 14, for example, indium is filled in gaps between the strands 9 and covered over the exposed portions thereof.

There will now be described the structure of the superconducting compound cable of this invention which is adapted for A.C. application. Electric current used in a superconducting compound cable includes direct and alternating currents. Even where direct current is applied, alternating factors can not be overlooked due to voltage fluctuations occurring while a superconducting magnet is excited or the cable is put into operation. Where a superconducting compound cable is put to A.C. application, the following difficulties arise:

(1) When superconducting materials belonging to the second type superconductor are used in a mixed state, then magnetic hysteresis loss takes place.

(2) With a cable containing a large number of fine cores which is provided with a stabilizing material, coupling current flows between the superconducting cores when sudden fluctuation occur in a magnetic field, bringing about a state equivalent to the case when superconducting cores increase in diameter, thus rendering the cable unstable as a whole.

(3) Where rapid fluctuations arise in a magnetic filed, a high conductivity matrix made of, for example, copper indicates a noticeable eddy current loss.

The magnetic hysteresis loss described under the item (1) is essentially unavoidable to a superconducting material. The loss is originally defined by the kind of superconducting material used. Adverse effects from coupling current described under the item (2) can be decreased by twisting superconducting cores or strands. Further, coupling current can also be reduced by a decline in the conductivity between the respective cores. Moreover, increased contact resistance between the respective cores effectively cuts off a loop of coupling current. This operation has the same effect as reduction in a stranding pitch of the strands, thus eliminating the necessity of unduly decreasing the stranding pitch. To minimize eddy current loss mentioned under the item (3), it is preferred that a stabilizing metal such as copper (including a matrix thereof) be used in an isolated state rather than in continuous mass form or divided into portions by a material of high electric resistance. In this sense, the superconducting compound cable of this invention in which the cores have their positions transposed and are embedded in a matrix of high electric resistance, and a stabilizing metal material is divided into portions or is used in a isolated state can display excellent A.C. characteristics. The cable of this invention should have a structure shown in FIG. 15 to be adapted for severe A.C. (pulsative and high frequency) application. In FIG. 15, all the strands (superconducting strand 9, a stabilizing metal strand 11 and reinforcing strand 13) are surrounded by a material 15 of high electric resistance or electrically insulating material 16 (organic or inorganic).

There will now be described by reference to FIG. 16 the electrically insulating structures of the cable of this invention. For electric insulation, the outermost portion of the cable 12 is surrounded by stranding, braiding or lapping a member consisting of one or more kinds of stripes of electrically insulated stabilizing metal material, stripes of electrically insulated reinforcing material and stripes of electrically insulating material. In FIG. 16, the outermost portion of the cable 12 is surrounded by a stainless steel tape 17 electrically insulated by organic material and the tape 17 is lapped in the opposite direction to the direction in which the cable 12 is stranded, thereby preventing the deformation of the cable 12 and providing an effective channels for a cooling medium between the turns of the tape 17.

The superconducting compound cable of this invention having the aforesaid structure has prominent industrial use due to the undermentioned advantages:

(1) The present cable of compacted stranded strands has high flexibility in two dimensional directions (flat wise and edge wise).

(2) Each strand of the present cable consists of a large number of fine cores having a substantially round cross section, fully eliminating the current anisotropy of the resultant cable, as is observed in the prior art tape-like cable.

(3) The structure of the present cable of compacted stranded strands has increased a strand-packing factor without considerably deforming or cutting superconducting cores, thereby enabling the cable to have a high current density as a whole.

(4) A large number of fine compound cores are twisted rendering the resultant cable essentially stable and prominently decreasing the A.C. loss of the cable.

(5) The present cable has such structure that a stabilizing metal material and a reinforcing material are separately located or isolated in the conductors, thereby reducing A.C. loss. Dispersion of the reinforcing material in the conductors saves them from local concentration of stresses.

(6) The present cable formed of compacted stranded strands has a flat and rectangular shape and is adapted to provide a large current carrying composite cable by assembling a plurality of constituent cables, thereby not only elevating a strand-packing factor but also reducing the local concentration of stresses.

There will now be described the method of manufacturing a superconducting compound cable according to this invention. Compacted stranded cables should be manufactured in such a manner as fully meets the undermentioned process requirements resulting from the intrinsic properties of superconducting compound material. The requirements are that.

(1) The strands are shaped easily and, when stranded together, saved from irregular intersections and also from constrictions in stranding and shaping processes.

(2) The stranding and shaping processes are applicable regardless of the kind and shape of the strand.

(3) The stranding and shaping processes can make the stranded strands to be produced in an elongated form and has uniform characteristics in the lengthwise direction of the cable.

(4) The stranding and shaping processes are applicable regardless of the structure of the conductor stabilized and reinforced by different method.

The prior art transposed- or stranded-compacted cable was manufactured with the view of reducing a void space between the strands for elevation of the current density of conductors rather than taking the above-mentioned requisite conditions into account. Therefore, the prior art manufacturing process could not meet the above-mentioned four requirements with respect to not only an intrinsically brittle superconducting compound cable but also an alloy type superconducting cable admitting of relatively easy plastic shaping. Consideration regarding difficulties described under the item (1) is most important for the purpose of preventing the cores of strands from being broken by local concentration of stresses applied to said cores, in other words, for the purpose of attaining the regular arrangement of strands. This invention provides an effective method of manufacturing a superconducting compound cable to meet the above-mentioned requirements. The present invention provides a method for manufacturing a superconducting compound cable which comprises the steps of:

(a) stranding a plurality of strands to provide hollow portions along and inside the stranded assembly, a superconducting compound in the form of filament being formed in the strands by a diffusion heat treatment;

(b) reducing the cross section of the stranded assembly by drawing said stranded assembly through a drawing die to such a reduction rate that the arciform length in cross section of two interfaces formed by contact between one strand and two adjacent strands falls within the range of 20 to 70% of the perimeter of the strand;

(c) flattening by the use of a Turk's head roll the reduced assembly of strands to eliminate hollow portions previously present therein and to cause said assembly to have a rectangular or trapezoidal shape in cross section to such a reduction rate that the total cross sectional area of all the strands accounts for more than 50% of that of a rectangle or trapezoid circumscribed about the periphery of said assembly; and (d) heating the flattened assembly at a temperature at which a superconducting compound material is formed in the strands.

There will now be described a superconducting composite strand (hereinafter referred to as "a strand") used in manufacturing a stranded superconducting compound cable according to this invention. The strand may have various structures shown in FIGS. 5 to 8. The strand includes a superconducting compound 7 diffused in the strand by heat treatment in the last step. During the manufacture of the cable before heat treatment, therefore, no superconducting compound 7 is produced. In the case of, for example, a $V_3Ga$-base cable, vanadium (shaped like a rod or foil) embedded in a Cu-Ga alloy matrix generally occupies the position of said superconducting compound 7.

A strand having a structure shown in any of FIGS. 5A, 5B and 5C is used in making a cable having a relatively small current capacity. An unreacted strand is prepared by a typical composite working method which, in the case of a $V_3Ga$-base cable, comprises the steps of embedding a vanadium rod in a Cu-Ga alloy matrix to provide a composite body and reducing the diameter of said composite body by drawing. Where a cable having a large current capacity is manufactured, a strand having a structure shown in any of FIGS. 6 to 8 is applied. In this case, a composite body contains a stabilizing material 11 having widely different workability and mechanical strength from other constituent metal materials. A composite body thus constructed is likely to raise the following problems during manufacturing steps such as drawing and shaping carried out before diffusion heat treatment.

(1) A metal tube of, for example, niobium, vanadium or tantalum acting as a barrier tends to be broken by machining, if said tube has a small wall thickness, resulting in a decline in the purity of a stabilizing metal material during diffusion heat treatment.

(2) Though the metal tube acting as a barrier should have as small a wall thickness as possible in order to elevate a packing factor of superconducting compounds in the strand, yet mutualdiffusion is likely to occur between said barrier material and other elements, eventually decreasing the purity of a stabilizing metal material.

(3) A decline in the purity of a stabilizing metal material during diffusion heat treatment leads to a decrease in the concentration of solute elements constituting reactants included in a reaction system for formation of the intended superconducting compound. As a result, the production of said desired superconducting compound consumes a great deal of time or in some cases becomes impossible.

This invention provides a stranded superconducting compound cable (including a method of its preparation) in which the strand has such a structure as makes the wall of barrier permissibly thin, improves workability, prevents reaction between a stabilizing metal material and other constituent members and promotes reaction for the formation of a desired superconducting materials, thereby resolving the above-mentioned problems.

Namely, the strand to be used in this invention is formed, as shown in FIG. 17A, by surrounding a stabilizing material 11 with a metal barrier material 10 solely or mainly consisting of niobium, vanadium or tantalum; surrounding said barrier with a diffusion-reaction controlling material 32; providing cores 7 formed of one of the constituent elements of a desired superconducting compound or an alloy thereof and a matrix 8 consisting of the other of said constituent elements or an alloy thereof around said diffusion-reaction controlling material 32; after the stranding and shaping processes applying a diffusion heat treatment to a composite body thus obtained, thereby forming superconducting compounds around the cores 7 or using said cores 7 themselves as superconducting materials. The barrier material 10 formed of niobium, vanadium or tantalum or an alloy thereof is intended to prevent mutualdiffusion between the stabilizing metal material 11 and at least two constituent elements or alloys thereof constituting a desired superconducting compound. The barrier material 10 should be the type which does not make diffusion-reaction with any of the stabilizing metal material 11 and said constituent elements, or makes such reaction only to a negligible extent.

The barrier material 10 may take various forms. In FIG. 17A, the barrier material 10 simply surrounds the stabilizing material 11. In FIG. 17B, the barrier material 10 is provided within the diffusion-reaction controlling material 32 to divide the stabilizing metal material 11 into a plurality of portions. In FIG. 17C, the alloy matrix 8 is surrounded with the diffusion-reaction controlling material 32 reversely from FIGS. 17A and 17B; and said diffusion-reaction controlling material 32 is surrounded with the barrier material 10. A plurality of such assembled bodies are scattered within the stabilizing material 11. Division of this stabilizing material 11 is for the purpose of minimizing A.C. loss occurring the normal conducting portion of the conductor and further elevating heat transfer through the conductor. The diffusion-reaction controlling material 32 formed of, for example, copper, silver, aluminum, gold, magnesium or lead takes the following actions (1) to prevent a metal such as niobium, vanadium, or tantalum surrounding the stabilizing metal material 11 from being oxidized during the manufacture of a superconducting compound cable according to this invention;

(2) to provide around the barrier material 10 a gap for causing the solute elements to have different concentrations, thereby suppressing interdiffusion therebetween;

(3) to promote reaction performation of a desired superconducting compound which takes place inside or outside the barrier material 10, thereby shortening reaction time, and in consequence substantially eliminating diffusion of the external solute elements in the stabilizing metal material 11 through the barrier material 10 and also mutualdiffusion between the barrier material 10 and stabilizing metal material 11;

(4) from the dynamic point of view, the stabilizing material 11 of generally very soft pure metal indicates a widely different hardness and work hardening rate from the barrier material 10 and the surrounding metal layers. Where the barrier tube 10 buckles or is broken during a working process, the diffusion-reaction controlling material 22 acts as a dynamic buffer to prevent the occurrence of such accidents.

This invention makes it possible easily to provide a stabilized superconducting compound cable having the abovementioned structure in which a decline in the purity of the stabilizing metal material 11 is suppressed, the good electric and thermal conductivity of the stabilizing metal material 11 is assured, and electric and thermal resistance between the stabilizing metal material 11 and superconducting compounds in prominently reduced through tight adhesion therebetween by mechanical work.

The superconducting compound cable of the invention has the following advantages:

(1) When formed inside a superconducting compound, then the stabilizing metal layer 11 has a larger practical thickness than when provided on the outside of said compound, offering advantages from the standpoint of size effect in electric resistance and magnetic resistance effect;

(2) the stabilizing metal layer 11 is provided inside or outside of the barrier 10 formed solely or mainly of niobium, vanadium or tantalum. The diffusion-reaction controlling material 32 is disposed outside or inside of said barrier material 10. Therefore, there takes place only diffusion-reaction required for formation of a superconducting compound. Proper selection of a reaction controlling material for said diffusion accelerates reaction for formation of a superconducting compound, thereby providing a large amount of diffused layer in a time shortened by that extent.

(3) Where superconducting compound layers are formed with the same cross sectional area, each layer can have its pratical thickness reduced for the reason give in the item (2). Therefore, the cable of this invention excels in adiabatic stability (a properly of suppressing the instability of a superconducting compound caused by its increased temperature resulting from a heat buildup under the adiabatic condition in which flux jumps arise, and also by repetition of said heat buildup denotes further inflow of a magnetic flux) as well as in dynamic stability (a property of suppressing the same instability of a superconducting compound as described in connection with the above-mentioned adiabatic stability when heat created in the superconducting compound escapes through the normal conductivity portions of the strand).

(4) The stabilizing metal material 11 presents a widely different work deformation from niobium, vanadium or other constituent metal materials included in the strand. However, the diffusion-reaction controlling material 32 acts as a dynamic buffer and prevents the cleavage of a cable sheath or the cutting off of said sheath in the form of an elongated strip.

There will now be described the sequential steps of manufacturing a stranded superconducting compound cable. First, description is given of the stranding and shaping processes according to this invention. To date, there has been developed a flat and rectangular shaped stranded strands manufactured by rolling and compacting a plurality of strands in the flat and rectangular form. According to the prior art stranded compacted strand-making process, a plurality of strands are set in the same circumference and stranded together to provide a coreless stranded strands. This stranded strands is subjected to biaxial rolling through a Turk's head roll (which consists of two sets of rolls intersecting each other at right angles in the same plane) to take a flat and rectangular form.

However, the above-mentioned prior art stranding process has the drawbacks that while being rolled and shaped, a plurality of strands locally present multiple intersection and are rendered ready to be cut, and moreover stranded strands brought to a Turk's head roll are liable to slip into the hollow portion because of their coreless structure. If an attempt is made to reduce the extent to which an assembly of stranded strands is deformed during passage through the Turk's head roll in order to eliminate the above-mentioned multiple intersection, then there result the difficulties that not only the shaped stranded strands tend to slip down after passing through the Turk's head roll, but also a void space in the cross section of the strands increases in amount, leading to a decrease in the strand packing factor.

The present inventors have conducted studies to eliminate the above-mentioned drawbacks accompanying the prior art process and, as a result, have found a method of producing flat and rectangular shaped stranded strands having a uniform cross sectional area and a large strand packing factor.

The stranding and shaping processes of this invention are carried out as follows. A plurality of round strands are first stranded together so as to be disposed on the same circumference and then drawn through a die to provide a reduced coreless assembly of stranded strands, in which a sum of the arciform lengths in cross section of two interfaces formed by contact between any one strand and the two adjacent strands accounts for 20 to 70% of the perimeter of one strand (or the circumference of one strand if it has a round cross section). Therefore, said coreless assembly of stranded strands is shaped by the use of a flattening device, for example, a Turk's head roll into a flat and rectangular or trapezoidal form. In this case, a mandrel or floating plug extending lengthwise of a die may be set at the center thereof to prevent the coreless assembly of stranded strands from slipping down.

Where said mandrel or floating plug is applied, strands need not be arranged on the same circumference in advance. The reason is that an assembly of stranded strands set around the mandrel or floating plug does slip down. No limitation is imposed on the peripheral outline of said mandrel or plug.

According to an aspect of this invention, a plurality of round strands are stranded together so as to be disposed on the same circumference. While being filled with a reinforcing core material in the coreless portion, the coreless assembly of stranded strands is drawn through a die. The strand assembly now filled with a reinforcing material is rolled and shaped in the Turk's head roll to provide a flat and rectangular or trapezoidal cable containing a reinforcing material as a core.

There will now be detailed by reference to the appended drawings the fundamental stranding and shaping processes applied in the making of a flat and rectangular superconducting compound cable according to this invention.

Referring to FIG. 18 showing a stranding and shaping device a plurality of round strands 19 are continuously delivered from a strand feeder 18, and stranded together as to be disposed on the same circumference as illustrated in FIG. 19, thereby forming a coreless assembly 20 of stranded strands. Said assembly is drawn through a die 22 provided with a die hole whose inlet side is opened wider than the outlet side. Later the assembly 20 has its outer diameter reduced to provide a coreless assembly 20a of stranded strands in which, as shown in FIG. 20 (cross sectional view on line III—III of FIG. 18), a sum of the arciform lengths in cross section of two interfaces formed by contact between any one strand $19_1$ and the two adjacent strands $19_2$, $19_3$ accounts for 20 to 70% of the total peripheral length circumference of said one strand $19_1$. The squeezed coreless assembly 20a of stranded strands is subjected to biaxial rolling in a Turk's head roll 25 (FIG. 21) comprising two sets of rolls 23 intersecting each other at right angles with a rectangular roll hole 24 formed at the center of the intersection. Thus, as shown in FIG. 22, a flat and rectangular shaped stranded assembly 26 comprising two upper and lower horizontal laminated rows of strands 19 and having a similar shape to said roll hole 24 is continuously produced to be taken up on a drum (not shown). At this time, said assembly 26 is not yet thermally treated and does not contain a superconducting compound shown in FIG. 4.

As mentioned above, the original coreless assembly 20 of stranded strands 19 in which said strands 19 make a line contact with each other along the lengthwise direction of the strands has its diameter reduced in advance by being drawn through the die 22 to cause the strands 19 to make a plane contact with each other and is rolled and shaped in the Turk's head roll 25 while care is taken to prevent the slipping down of said reduced coreless assembly 20a of stranded strands 19.

The reason why a sum of the arciform lengths in cross section of two interfaces formed by contact between any one strand $19_1$ and two adjacent strands $19_2$, $19_3$ is chosen to account for 20 to 70% of the total peripheral length of said one strand $19_1$ is as follows if the above-mentioned sum is smaller than 20%, then the slipping down of the reduced coreless assembly 20a of stranded strands 19 is likely to occur; and if said sum exceeds 70%, then the reduced coreless assembly 20a presents difficulties in causing the constituent strands 19 to be arranged in two upper and lower horizontal rows in the subsequent shaping step by the Turk's head roll 25, and friction between the mutual strands 19 is increased, thus making the shaping difficult.

Generally the strands 19 are stranded preferably in a number of seven or larger. Moreover, an odd number is preferred to an even number for the reason that the odd number provides easier and smoother stranding and causes the respective strands 19 to have an equal cross sectional area (FIG. 22). The stranding and shaping steps included in the cable-making method of this invention are not limited to those described above. It is possible first to prepare a squeezed assembly 30a of stranded strands and take up said assembly 20a on a drum and later roll and shape said assembly 20a by a Turk's head roll 25 in a separate step. Further, it is possible to insert a mandrel 27 (FIGS. 23, 24) whose base end portion takes a round columnar form and whose forward end portion is shaped like a truncated pyramidal (or wedge) form into the die 22 provided with a die hole 21 having a rectangular cross section; continuously strand a plurality of strands 19 around said mandrel 27 so as to dispose them on the same circumference; lead said stranded strands 19 towards the forward end of the mandrel 27, that is, in the die 22 squeeze said stranded strands 19; to provide an angular tubular coreless assembly of stranded strands 20b; and finally roll and shape assembly 20b into a flat and rectangular form by the Turk's head roll 25.

Application of the mandrel 27 prevents the slipping down of the original coreless assembly 20 of stranded strands. Moreover, squeezing of the assembly of stranded strands is effected in the shape approximating a finally flat and rectangular form. Consequently, it is possible to manufacture superconducting compound cables with a uniform quality.

The mandrel 27 is not restrictively chosen to take a truncated pyramidal shape at the forward end, but said forward end may be shaped like a cone. Further, the mandrel 27 may be the type which, as shown in FIG. 25, penetrates the die 22 and whose forward end extends up to the inlet side of the Turk's head roll 25. A plug used in place of the mandrel 27 can display the same effect as the mandrel 27.

Further, a superconducting compound cable according to this invention may also be formed first by preparing an original coreless assembly 20 of stranded strands 19 by the stranding and shaping device (FIG. 18); inserting a reinforcing core material 28 (FIG. 26) into the central portion of said original coreless assembly 20; squeezing said composite mass through the die 22 to provide a reduced assembly 20a of stranded strands; and finally rolling and shaping said reduced assembly 20a by the Turk's head roll into a flat and rectangular form.

The reinforcing core material 28 may be supplied through a slit 29 open at the center of the forward end of a mandrel 30 (FIG. 27) whose base portion is shaped like a round column and whose forward end takes a truncated pyramidal form. The mandrel 30 is not restrictively chosen to have its forward end portion shaped like a truncated pyramid, but said forward end portion may take a conical form bored with a slit 29. Replacement of the mandrel 30 by a plug 31 can also provide a cable which is not yet subjected to a diffusion heat treatment, and has a structure shown in FIG. 11. In this case, said plug 31 may have such structure that as shown in FIG. 28, a slit 29 extends to an intermediate point on the lateral side of said plug 31; the base portion presents a smooth curved plane; and the bottom portion is formed into a smooth projecting curved plane.

There will now be described the conditions required for the processes (particularly the shaping process) of a superconducting compound cable of this invention.

In case a composite body composed of metal materials having different degrees of work deformation is subjected to hot or cold working, supposing the cross sectional area of said composite body is reduced for example into a round shape, the constituent materials present little similar cross sectional shapes to those which are observed when said constituent materials are initially assembled into a composite body. This event also occurs with a composite body (a precurson of a strand) constituting the superconducting compound cable of this invention. Namely, when subjected to the ordinary hot or cold working, the composite body used in this invention also indicates such structure as shown in FIG. 29, in which the cores have considerably flattened or elliptic cross sections. As previously described, flattened superconducting cores render the resultant cable unstable due to current anisotropy. Particularly this problem occurs more often in rolling for a dynamic reason than in drawing. Therefore, full care should be taken in the shaping process of this invention.

From the above consideration, this invention provides a method of manufacturing a superconducting compound cable having such a structure as shown in FIG. 4, in which the major axis of the cross section of each core bears a ratio ranging between 1 and 2 to the minor axis of said cross section.

There will now be further detailed the shaping process of this invention. Among the constituent metal materials which constitute a superconducting compound formed by diffusion heat treatment, a first metal material is used as a matrix. A plurality of second core metal materials with a circular cross section are embedded in said matrix so as to make a composite body. The metals constituting superconducting compound include Nb, Sn, V, Ga and alloys thereof. Where, for example, a Nb$_3$Sn-base superconducting compound cable is manufactured, then Nb or an alloy thereof is used as a first metal and formed into a matrix, and Sn or an alloy thereof is used as a second metal and embedded as a core in said matrix, thereby providing a composite body. Or conversely from the above-mentioned case, the composite body may be formed of Nb or an alloy thereof used as a core and Sn or an alloy thereof used as a matrix.

The composite body thus obtained is subjected, if necessary, to hot extrusion to have the outer diameter reduced. This reduced composite body is further subjected to repeated hot working such as extrusion, rolling and drawing at a temperature between both recrystallization temperatures of the first and second metals or is subjected to the cold working by repeatedly carrying out intermediate annealing at a temperature within the range as described above. The composite body presents a finished shape by carrying out the working. In FIG. 30 showing the range of the treating temperature, the curve I denotes the softening curve (hardness curve) of the first metal used as a matrix, the curve II shows the softening curve of the other metal, and $T_1$, $T_2$ indicate the recrystallization temperatures of the first and second metals. As used herein, the term "recrystallization temperature" is defined to mean a level at which the metal presents hardness lying in the middle of the fully hardened and the fully softened states. The recrystallization temperature is chosen to be about 450° C. for Cu-Sn alloy, about 580° C. for Nb, about 400° C. for Cu-Ga alloy and about 530° C. for V.

Referring to FIG. 30, the all composite body remains hardened in the temperature range A (lower than $T_1$). At this level of temperature, any mechanical treatment is difficult to carry out, because both metals used as a matrix and core respectively present great resistance to deformation and indicate little difference in hardness. In the temperature range B, (between $T_1$ and $T_2$), the first metal used as the matrix is rapidly softened and presents a noticeably decreased resistance to deformation, whereas the second metal used as the core still retains a relatively high hardness as shown by the curve II, giving rise to a considerable hardness difference between the first and second metals. Therefore, treatment in said temperature range B causes the matrix to be preferentially deformed with the core kept in a substantially round form in cross section. Accordingly, it is possible to provide strands having a thin and wide rectangular cross section with the cross heat substantially round therein. The above-mentioned heat treatment (including hot working and intermediate annealing) should be carried out most preferably at a temperature Tm at which the first and second metals indicate a largest hardness difference. Practically, this treatment is used in hot working or intermediate annealing among turns of cold working. The cold working is effected by repeating annealing when the matrix of the composite body already annealed in the temperature range B has its hardness increased to a level of $H_1$ by work-hardening, thereby deforming the matrix metal preferentially through repetition of the above-mentioned operation. Treatment in the aforesaid temperature range B is applicable to extrusion, drawing, stranding, rolling for example by the Turk's head roll, groove rolling and two step- or multi step-rolling all applied in the cable manufacturing method of this invention. A composite body having a finished shape through treatment in the temperature range B is further subjected to diffusion heat treatment to form, as shown in FIG. 4, a superconducting compound layer 7 between the matrix 8 and core materials 6. Thus there is produced a superconducting compound cable in which a plurality of superconducting core compounds 7 are embedded in the matrix 8. The minor axis of the cross section of each superconducting core compound 7 bears a ratio of 1:1 to 1:2 to the major axis of said cross section.

Treatment in the temperature range C (higher than $T_2$) is inapplicable because both matrix and core materials are considerably softened and simultaneously deformed by working. The reason is that the cores are deformed, as shown in FIG. 29, into an oblong shape by stress acting in the thickness direction.

According to the cable-manufacturing method of this invention, the aforesaid shaping work may further be followed by the processes of removing some of the strands of the shaped cable and providing a stabilizing and/or reinforcing material in the space or grooves thus emptied in order to render said cable more stabilized and/or reinforced.

There will now be described these additional processes. As previously mentioned, the stranded superconducting compound cable of this invention is provided with a reinforcing, stabilizing or insulating material as need arises and has such a structure as admits of variation in current capacity. These objects can be attained by providing a stabilizing and/or reinforcing material in the respective strands of the cable, as shown in FIGS. 6, 7, 8 and 17 or providing a stabilizing, reinforcing or insulating material outside of the strands as illustrated in FIGS. 10, 11, 13, 14, 15 and 16. Obviously, in latter case the strand is preferred to contain a stabilizing or reinforcing material. The aforesaid object can also be achieved by replacing some of the strands of the cable, as shown in FIG. 9, with a stabilizing or reinforcing material.

However, the stranded cable having a structure shown in FIG. 9 can not be provided by a process of stranding strands which will form therein superconducting compounds by diffusion heat treatment with other strands of the same size which are solely of a stabilizing or reinforcing materials. The reason is that though stranding may be carried out, the subsequent shaping can not be effected, because the strands of a stabilizing or reinforcing material have widely different working and annealing temperatures from the strands to form superconducting compounds therein. Following are detailed reasons:

(1) a reinforcing material generally has high hardness and little elongation, thus imposing considerable limitation on the working efficiency of rolling and shaping said reinforcing material with strands and making it difficult to reduce void spaces in the cross section of the conductor for elevation of current density.

(2) When strands solely made of pure copper and composite strands which will produce therein a superconducting compound by diffusion heat treatment are worked together, then said copper strands present noticeably uneven deformation and sometimes result in breakage.

(3) In the final diffusion heat treatment for the formation of a superconducting material, mutualdiffusion is likely to occur between a strand of the reinforcing material and a strand which will produce in it a superconducting compound, with the result that the reinforcing material decreases in mechanical strength and the cable thus obtained loses its flexibility due to the adhesion between both strands.

This invention can manufacture a cable stabilized and/or reinforced as shown in FIG. 9 by adopting the following steps in order to eliminate the above-mentioned difficulties. Namely, after the fundamental shaping process and before or after the succeeding diffusion heat treatment for formation of superconducting compounds in the strands, (1) a desired number of strands are removed, and (2) either or both of stabilizing and reinforcing materials are placed in groove-like void spaces left after removal of said strands, thereby producing the cable which is stabilized and/or reinforced as shown in FIG. 9.

Some of the strands can be easily removed by being untwisted by the reverse operation of, for example, a stranding machine.

A stabilizing and/or reinforcing material being placed in the above-mentioned groove-like void spaces is desired to have approximately the same dimension as the strands taken off. Where the removing process is conducted before diffusion heat treatment, the surface of the stabilizing or reinforcing material should preferably be coated with a material such as an oxide film or carbon layer which is effective to suppress the diffusion of a metal material. The process of placing a stabilizing and/or reinforcing material can be properly effected for example by a stranding or tape-lapping machine. Where a cable contains superconducting compounds already formed by diffusion heat treatment, the above-mentioned process of placing a stabilizing material may be effected by passing the cable through a bath of the molten stabilizing material, for example, indium to fill with said indium the groove-like spaces left after removal of some of the strands or the void spaces lying between the remaining strands of the cable. It is possible further to subject the cable thus obtained to slight working by means of, for example, rolling in order to cause the cable to have a proper outer diameter.

The cable stabilized and/or reinforced as shown in FIG. 9 is composed of a plurality of strands 9 containing superconducting compounds formed by diffusion heat treatment and a plurality of stabilizing and/or reinforcing materials 11 provided in place of some of strands 9.

There will now be described the heat treating process, one of the processes included in the cable-manufacturing method according to this invention. The method of manufacturing the superconducting compound stranded cable of FIG. 4 comprises the steps of embodying cores in the alloy matrix, drawing and stranding strands and forming superconducting compounds in the interface between the cores and alloy matrix by diffusion heat treatment. The diffusion heat treatment is generally carried out in a nonoxidizing atmosphere kept at a constant temperature ranging between 600° and 800° C. for 50 to 100 hours. The above-mentioned conventioned heat treatment may be utilized in the method of this invention for production of any superconducting compound. Where the outermost portion of the strand is formed of copper or an alloy thereof, said heat treatment can be more properly carried out, if the following requisite conditions are taken into account.

(1) Foreign atoms should be prevented from being carried into the matrix when diffusion heat treatment is conducted. The reason is that intrusion of foreign atoms retards the diffusion heat treatment for formation of superconducting compounds and sometimes leads to the failure to form said compounds themselves.

(2) The strands or matrices should be prevented from being fused together by mutualdiffusion. The reason is that fusion or adhesion mutualdiffusion not only prevents the compacted stranded cable of FIG. 4 from displaying the original dynamic properties, but also prominently reduces a crytical current value when the cable is bent, with the result that the cable can not practically.

(3) After diffusion heat treatment, the surface of the strands or matrix should have a metal plane. The reason is as follows.

As a superconducting compound cable generally has longer than 1000 meters a precursor of the cable, that is a shaped assembly of strands is subjected to heat treatment in a bundled, coiled, or helical state; the turns of a precursor thus wound sometimes contact each other, resulting in mutualdiffusion at said contact points and surfaces and in consequence presenting difficulties in manufacturing a superconducting cable for the same reason given in the item (2).

However, usually a cable-making method further includes the process of soldering or plating a stabilizing metal material after the diffusion heat treatment. In this case, a clean metal plane should be exposed on the surface of the strand thus treated to elevate the efficiency of said soldering or plating process.

For example, in the case of the item (2), the surface of the cable precursor is coated with an oxide film before the formation of a superconducting compound in order to prevent the respective strands or matrices from being fused together by mutualdiffusion. Therefore, a low-melting metal such as indium or tin should be plated on the surface of the cable for stabilization after said oxide film is removed to cause a clean metal plane to appear on the surface of the cable. This process has hitherto presented considerable difficulties in the making of a superconducting compound cable. An atmosphere in which the conventional diffusion heat treatment was effected was kept at pressures ranging from the atmospheric to $10^{-4}$ mmHg, thus causing the exposed metal surface to be unavoidably coated with an oxide film. To meet the requirement of the item (3), therefore, it was necessary to undertake a chemical or physical treatment for removal of such oxide film.

Where copper or an alloy thereof constitute at least the surface of strands of superconducting compound cable, the present invention provides such diffusion heat treatment as causes the superconducting compound cable to display its fundamental superconducting properties meeting the aforesaid requirements. For the object of this invention, a cable precursor constituted by the strands at least the surface of which is formed of copper or an alloy thereof should be heat treated at pressures ranging from the atmospheric to $10^{-3}$ mmHg, until superconducting compounds are formed in the strands, and, after formation of said superconducting compounds, in an atmosphere evacuated to a higher extent than $10^3$ mmHg or in a reducing atmosphere.

There will now be described in detail diffusion heat treatment included in the cable-making method of this invention. Before diffusion reaction for formation of a superconducting compound, the surface of the strand may be in a metallic or oxidized state. Diffusion reaction carried out at pressures ranging from the atmospheric to $10^{-3}$ mmHg forms a copper oxide film on the surface of the strands to suppress mutualdiffusion therebetween. If, in this case, said diffusion reaction is temporarily stopped in the initial stage and the strands are quenched in water or subjected to proper plastic working, then the copper oxide film obtained becomes denser. In the later and final stages of the diffusion reaction, vacuum is maintained at a higher level than $10^{-3}$ mmHg, or air is substituted by a reducing gas such as $H_2$ or CO to decompose the copper oxide film, thereby causing the metal surface of the strands to be exposed or said surface to be only coated with lower copper oxides. Therefore, the exposed surface of the strand becomes more wettable to a soft metal or more adapted for soldering, elevating the efficiency of the process of coating said surface with a stabilizing or reinforcing material.

The reason why the oxide film is removed in a higher vacuum than $10^3$ mmHg during the above-mentioned heat treatment is that while an oxide film formed of copper and oxygen can be almost fully removed in a vacuum of about $10^{-3}$ mmHg and completely removed in about $10^{-4}$ mmHg, on the other hand, an oxide film formed of a copper alloy and oxygen can not be sufficiently removed in a vacuum of about $10^{-4}$ mmHg, if said alloy contains several percent of an element such as tin, gallium, aluminium, silicon or nickel which has a greater affinity to oxygen than copper, making it necessary to apply higher vacuum. Lower vacuum than $10^{-3}$ mmHg fails to remove an oxide film.

An oxide film formed on the surface of the strand during the heat treatment well serves the purpose if it has a thickness ranging from 0.5 to 5 microns. The reason is that a smaller thickness than 0.5 micron tends to cause strands to be fused together by mutualdiffusion and a larger thickness than 5 microns presents consierable difficulties in removing the oxide film in the subsequent step.

There will now be described the method of joining superconducting cable by using stranded superconducting compound cables according to this invention.

The joint of superconducting cables includes various formes: (1) joint with superconducting and normal conductive cables for current lead; (2) joint between superconducting alloy cables; (3) joint between superconducting alloy and compound cables; and joint between superconducting compound cables. The forms of the types (2) to (4) are referred to as "superconducting joint". Application of a stranded superconducting compound cable of this invention admits of any of the above-mentioned four forms of joint.

Superconducting cables should be jointed in a manner meeting the undermentioned requirements.

(1) Electric resistance should be as low as possible.

The superconducting cables should not be shifted to a normal conductive state even by heat buildup in the cable joint resulting from contact resistance between the superconducting cable. Where a superconducting magnet having said joint is used in a state of permanet current, electric resistance in the cable joint has a direct bearing on attenuation of current, so that it is necessary to decrease said electric resistance as low as possible.

(2) A system of jointed cables should remain stable.

The system should be fully assured of superconductivity even where fluctuations occur in current or the magnetic fieled or the system undergoes mechanical shocks.

(3) A cable joint should be compact.

Construction of a superconducting device requires application of a cryogenic apparatus or expensive liquid helium. Therefore, a compact cable joint reduces cost related to said application.

(4) Cable joint should be conducted easily with high operative reliability.

To date, various cable jointing processes have been proposed on the basis of the aforesaid requirements. However, no process has been developed which enables superconducting compound cables to be jointed with high operative reliability. The main reason is that such superconducting compound cable is intrinsically or inherently brittle; it is impossible to join only superconducting compounds by picking up them from composite cables; the cable joint can not be rendered compact; and cable joint demands considerably complicated operations.

The present inventors have conducted diligent studies to eliminate the above-mentioned drawbacks accompanying joint of superconducting cables, and, as a result, have found a method of easily jointing said cables without losing the properties thereof through application of stranded superconducting compound cables of this invention.

The cable-jointing method of this invention comprises the steps of disposing a stranded superconducting compound cable of this invention between the mutually facing ends of any other superconducting cable being jointed together so as to cause both end portions of the cable of this invention to be overlapped on said mutually facing ends; boring plurality of crosswise penetrating holes in the overlapped portions of the cable of this invention and said two jointable cables; inserting a small superconducting rod through said holes; if necessary, tightly pressing the rods against the inner walls of the holes; heating the assembled portion to a higher temperature at which the superconducting rods present the form of solid solution or are melted; forming a different kind of superconducting material or crystalline particles in solid solution at the interfaces between said superconducting rods and surrounding cables; and finally solidifying the entire jointed portion with cooling.

There will now be described the cable-jointing method of this invention by reference to the appended drawings. As shown in FIG. 31 (FIG. 31A is a side view of an entire assembly of jointed cables, and FIG. 31B is a plan view thereof) both end portions of a stranded superconducting compound cable 12 of this invention used as a connector are overlapped at the portions 34 on two superconducting cables 321, 322 being jointed. The overlapped portions 34 of said cables 321, 322, 12 are bored with a plurality of crosswise penetrating holes. A plurality of small superconducting rods 33 are inserted through said holes to be brought into intimate contact with the inner walls of said holes. The superconducting rods 33, superconducting cables 321, 322 being jointed and the stranded superconducting compound cable 12 used as a connector are all maintained at a temperature at which said superconducting rods 33 and superconducting materials in the cables 321, 322, 12 present the form of solid solution, thereby causing the superconducting materials to be crystallographically bound. FIG. 32 schematically illustrates the enlarged cross section of each overlapped portion 34 of the connector 12 and the superconducting cables 321, being jointed. In FIG. 32A, there are overlapped on each other the each end of jointable superconducting cables 321, and the cable 12 formed of metal matrices 81, 82 and superconducting materials 71, 72 represented by the general formula of $A_xB_y$ and embedded in said metal matrices 81, 82. The overlapped portions 34 are bored with a penetrating hole, into which there is inserted a composite superconducting rods 33 consisting of a core material 6 and a superconducting material 73 represented by the general formula of $C_uD_v$. When the assembled portion is heated, the metal matrices and superconducting material react with each other or jointly present the form of solid solution, thereby providing a new superconducting phase 74 represented by the general formula of $A_xB_y+C_uD_v$ as shown in FIG. 32B. Reaction for formation of said new superconducting phase 74 may be (1) the type in which, as in $V_3Ga$, solid diffusion reaction takes place between a Cu-Ga matrix and V core or (2) the type in which there takes place a quasi-binary solid solution reaction like the above-mentioned reaction expressed as $A_xB_y-C_uD_v \rightarrow A_xB_y+C_uD_v$. A superconducting material prepared by quasi-binary reaction should display desired superconducting property under any condition in which the jointed cable is used.

Typical quasi-binary reaction systems include vanadium base compounds such as $V_3Si$-$V_3Ga$, $V_3Ge$-$V_3Al$ and $V_3Ga$-$V_3Al$ and niobium base compounds such as $Nb_3Sn$-$Nb_3Al$, $Nb_3Sn$-$Nb_3Ge$, and $Nb_3Al$-$Nb_3Ge$.

To provide the proper binding of composite superconducting compounds at the portions 34, reaction-obstructing material should preferably be eliminated beforehand, for example, by a chemical process in order to accelerate the above-mentioned desired reaction by priority.

Superconducting cables may be jointed in the form of FIG. 31A and FIG. 31B in which the stranded superconducting compound cable of this invention, joints two jointable superconducting cables positioned at different levels on one plane, in the form of FIGS. 33A and 33B in which the cable of this invention bent flatwise and edgewise respectively, joins two jointable superconducting cables, or in the form of FIG. 33C in which the stranded cable of this invention bent flatwise and at the same time edgewise, joints two jointable superconducting cables.

As previously described, the jointing method in this invention comprises the steps of bringing a compound or alloy type superconducting rod into simple physical contact with a superconducting compound cable and later causing said rod and cable to be crystallographically combined by heat treatment. However, it is preferred to apply a compression stress to the cables, as shown in FIG. 33D by tightening means 35 such as a pin, rivet or bolt.

The term "crystallographical binding", as used herein is defined to mean the type in which mutualdiffusion takes place over considerable areas between single crystal or polycrystal superconducting compounds, between one of said compound and any component element of the other compound, or between any of the components of said compound and any of the components of the other compound. These superconducting compounds and the component elements thereof can jointly form new superconducting compound in the interface of said single crystal or polycrystal superconducting compounds. The interface disappears through binding of said single crystal or polycrystal superconducting compound, and the regions are crystallographically combined.

The cable-jointing method in this invention displays the following advantageous effects:

(1) Superconducting compounds disposed in the joint portions are crystallographically bound and present extremely low electric contact resistance which is theoretically reduced to zero in a superconducting state, noticeably improving attenuation of current in the joint portions;

(2) Either temporary maintenance of the joint portions at a certain level of temperature during cooling or reheating of said joint portions not only assists in preventing thermal strains from occurring inside and outside of the superconducting compound phase and joint portions and in forming a new superconducting compound, but also in converting the crystals of superconducting compound into a more stoichiometric substance, thereby elevating critical current density and temperature;

(3) The joint portions are rendered compact (for example, 100 mm long). Further, the requisite conditions in which cables are to be jointed can be metallographically defined, if the chemical composition of superconducting compounds of both connector cable and cables being jointed, atmosphere, time and pressure applied are set at a proper level; and (4) Application of a stranded superconducting compound cable of this invention as a connector causes the two-dimensional flexibility of said cable characterizing the shaped stranded strands to act favorably in jointing superconducting cables in any direction and arrangement.

This invention will be more fully understood by reference to the examples which follow.

EXAMPLE 1

Where a stranded superconducting compound cable of this invention is manufactured which has a stranding pitch P of 20 mm, a width W of 4.1 mm, and an allowable bending radius $R_0$ is 13 mm, it has been found in advance that the cable should have a smaller thickness than 0.27 mm as calculated from the previously given relationship $t_0 = 2R_0 \times \epsilon_0 \times (1 + 4W^2/P^2)$. (Wherein an allowable strain $\epsilon_0$ of a compound of $Nb_3Sn$ was 0.6%.) The above-mentioned cable thickness of 0.27 mm was a value obtained by multiplying 3/2 by a value calculated from said equation.

Exactly speaking, the term $t_0$ denotes a distance between the upper and lower outermost superconducting compound cores located in the cable. With a cable containing two rows of strands, however, a surplus amount of matrix metal is provided with a thickness equal to about one third of the thickness of the entire cable. Therefore, the practical cable was taken to have a thickness of 0.27 mm equal to 3/2 times of $t_0$.

The stranded superconducting compound cable of this invention was manufactured in the following manner so as to provide the above-mentioned dimensions. Seventeen pure niobium rods were embedded in a copper-tin alloy containing 10 percent by weight of tin. The composite was drawn until it had an outer diameter of 0.3 mm and then was twisted at a pitch of 10 mm, providing a strand. Fifteen strands thus obtained were stranded at a pitch of 20 mm to provide a coreless or hollow assembly of strands. The assembly was rolled by a Turk's head roll (two directions roll), providing a compacted stranded cable (exactly speaking a cable precursor which has not yet had a superconducting compound therein) having a cross section of 0.25 mm × 4.1 mm. At this time, the strands-packing factor indicated 96%. The cable precursor was heat-treated 35 hours at 680° C. in a furnace evacuated to an extent of $3 \times 10^{-4}$ mmHg to form a superconducting $Nb_3Sn$ compound in interfaces between the niobium rods and copper-tin alloy matrix.

For comparison with a superconducting cable according to this invention, there was provided a prior art flat and rectangular cable constructed as illustrated in FIG. 3 with a cross section of 0.25 mm × 3.9 mm and 255 cores.

The present cable and control cable were respectively dipped in a molten indium bath to fill with indium interstices among the strands and to coat the cables.

Current was introduced at a temperature of 4.2° K. and a magnetic field of 70 kG through both cables which were kept straight without being bent in a cryostat containing liquid helium. Both cables were changed into a state of normal conductivity at 920 amperes. Later when current was introduced similarly at a temperature of 4.2° K. and a magnetic field of 70 kG through both cables which were bent flatwise with a bending radius of 13 mm, then the present cable indicated 920 amperes, whereas the control cable stood at 238 amperes. Where both cables were edgewise bent with a bending radius of 25 mm, and current was introduced similarly at a temperature of 4.2° K. and a pressure of 70 kG, the present cable was changed into a state of normal conductivity at 915 amperes, whereas the control cable indicated 72 amperes, proving that electric resistance occurred therein from the initial stage of current introduction.

The results of the above-mentioned measurements show that where both cables were bent flatwise with a bending radius of 13 mm, the present cable showed a critical current value of 920 amperes equal to that measured when the cable was not bent at all, proving that flatwise bending with a radius of 13 mm did not harmfully affect the present cable at all. In contrast, the critical current value of the control cable sharply dropped from 920 amperes to 238 amperes, showing the $Nb_3Sn$ compound of the control cable was considerably damaged. Where both cables were edgewise bent with a bending radius of 25 mm, the present cable showed a critical current of 915 amperes. Though it represents a decrease of 5 amperes from the above-mentioned critical current of 920 amperes, said measured critical current of 915 amperes falls well within the range of allowable errors of measurement, namely, proving that the present cable was not damaged at all by edgewise bending either. In contrast, the edgewise bending caused the control cable to have its critical current sharply reduced from 920 amperes to 72 amperes, indicating the $Nb_3Sn$ compound of said control cable was substantially destroyed.

Therefore, the control cable can be bent only with a large allowable bending radius than the present cable, insofar as its superconducting property is not deteriorated, proving that said control cable is not applicable except when the cable is flatwise bent with rather a larger bending radius.

EXAMPLE 2

2310 rods of pure vanadium and one OFHC copper (oxygen free high conductive copper) rod sheathed with tantalum were embedded in a copper-gallium alloy matrix containing 19% by weight gallium with said copper rod located at the center of the matrix. The composite was drawn until it had a diameter of 0.5 mm and then twisted at a pitch of 8 mm to provide a strand. Seven strands thus prepared were stranded together at a pitch of 25 mm to provide a hollow assembly of strands. The assembly was rolled by a Turk's head roll, providing a cable precursor having a cross section of 0.2 mm × 5.1 mm. At this time, the strand-packing factor indicated 89%. The cable precursor was heated 50 hours at a temperature of 650° C. in a furnace evacuated to an extent of $1 \times 10^{-4}$ mmHg, forming a superconducting $V_3Ga$ compound in an interface between the vanadium rods and the copper-gallium alloy matrix. The cable thus manufactured had an allowable bending radius of 9.51 mm as measured from the aforesaid relationship, with the term $t_0$ taken to be two-thirds of 0.2 mm for the same reason given in Example 1, and the allowable strain $\epsilon_0$ taken to be 0.6%.

The above-mentioned cable of this invention was cut up in two elongate sections. One section was laminated with one compacted stranded cable comprised of seven OFHC copper strands having a cross section of 0.1 mm×5.1 mm in a bath of molten indium, and then insulated with polyvinyl butyral resin (10 micron thick) to provide a cable I. The other section was heated 15 minutes at 600° C. in the open air to coat the surface of the strands with a dense oxide film. The other section thus heated was further tape-lapped with an OFHC copper foil 0.05 mm thick and 3 mm wide coated with polyvinyl butyral resin, providing a cable II.

Current was introduced through both cables I, II bent flatwise with a bending radius of 10 mm at a temperature of 4.2° K. and a magnetic field of 70 kG. The cables I, II were changed in a state of normal conductivity at 890 and 895 amperes respectively. However, no electric resistance arose in either of said cables I, II proving that no damage of superconducting compounds occurred and, proving that the flexibility of said cables I, II was assured. This fact indicates that the calculated allowable bending radius $R_0$ of 9.51 mm was correct.

Further, the cables I, II were coiled about a solenoid. An external magnetic field was applied to draw a magnetization curve by a search coil. A.C. loss was calculated from an area defined by said curve. The external magnetic field was 0.7 to 18 kG and the frequency was 0.005 to 0.5 Hz and had a triangular wave shapes. While hysteresis loss of $V_3Ga$ was substantially equal in both cables I, II the cable I indicated larger hysteresis loss resulting from a normal conductive metal. This undesirably event was caused by heavy eddy current loss in the normal conductive metal resulting from the OFHC copper and indium and suppression of coupling current was not properly effected, because the respective strands were not insulated. In contrast, the cable II in which the respective strands were insulated separately was found to present prominently little overall loss resulting from the normal conductive metal.

EXAMPLE 3

Thirteen strand precursors as obtained in Example 1 in which the superconducting compound of $Nb_3Sn$ had not yet been formed and two silver wires 0.3 mm in outer diameter coated with Cu-Sn alloy were straned at a pitch of 15 mm to provide a hollow assembly of strands. The assembly was rolled by a Turk's head roll to provide a compacted stranded cable precursor having a cross section of 0.25×4.1 mm. The cable precursor was inserted into a groove with a cross section of 0.255×4.11 mm of a 50-micron thick OFHC copper foil clothed with a 10-micron stainless steel tape and to provide a composite assembly as shown in FIG. 10. The assembly was heat-treated 34.5 hours at 680° C. in a vacuum furnace evacuated to $9 \times 10^{-1}$ mm Hg, forming a superconducting compound of $Nb_3Sn$ in an interface between the niobium cores and copper-tin alloy matrix in each strand. The assembly was further heated 30 minutes in said furnace which was more evacuated to $5 \times 10^{-5}$ mm Hg, followed by cooling. A cable thus obtained was impregnated with indium in a bath of molten indium.

When current was introduced at a temperature at 4.2° K. and a magnetic field of 70 kG through said cable which was bent with a bending radius of 13.5 mm, then the cable was changed into a state of normal conductivity at 790 amperes. At this time, current density indicated $8.9 \times 10^4$ A/cm$^2$, as in Example 1. This proved that the cable of Example 3 was also assured of sufficient flexibility even when bent with a bending radius of 13.5 mm. The allowable bending radius of the cable was calculated to be 10.7 mm from the above-mentioned relationship.

EXAMPLE 4

Seven strand precursors as obtained in Example 2 in which a superconducting compound of $V_3Ga$ not yet been formed were stranded to provide a hollow assembly of stranded strands as in Example 2. A stainless steel tape measuring 0.1×3.0 mm was inserted into the hollow core space. The assembly was rolled by a Turk's head roll to provide a compacted stranded cable precursor having a cross section of 0.2 mm×5.1 mm. Four cable precursors thus shaped were stranded at a pitch of 20 mm about a square OFHC copper tube 5.0 mm×5.0 mm in outer dimensions and 3.5 mm×3.5 mm in inner dimensions, which was provided with an arcuate edge having a radius of 0.2 mm at each corner of the cross section. The composite assembly was rolled by a Turk's head roll to provide a square hollow cable precursor 5.4 mm×5.4 mm in outer dimensions. The rolled cable precursor was heated 50 hous at 650° C. in a vacuum furnace evacuated to $1 \times 10^{-4}$ mmHg, forming a superconducting compound of $V_3Ga$ in an interface between a vanadium rod and a copper-gallium alloy matrix in each strand. Void spaces which still remained in the cable up to this point were filled with indium. Thereafter, the surface of the cable was insulated with a 10-micron thick polyimide resin tape.

Current was introduced at a temperature of 4.2° K. and a magnetic field of 70 kG through the cable which was bent into a circular form with a diameter of 250 mm. Then the cable was changed into a state of normal conductivity at 4305 amperes. The cable of Example 4 had the same current density as the sample of Example 2 and was assured of sufficient flexibility.

EXAMPLE 5

Fifteen Nb core rods 3 mm in diameter were inserted into a Cu-Sn alloy matrix billet 40 mm in outer diameter and 100 mm high, which contained 10% of tin. The composite thus formed was hot-extruded at 800° C. to be reduced to an outer diameter of 10 mm, and further drawn at 550° C. to be reduced to an outer diameter of 1 mm. Said 1 mm wire was twisted together at a pitch of 5 mm. When drawn to half the original sectional area, the twisted wire was annealed at 500° C., and further drawn to an outer diameter of 0.3 mm. Fifteen of said 0.3 mm wires were stranded together at a pitch of 20 mm to provide a hollow assembly of stranded strands. Said hollow assembly was rolled by a Turk's head roll preheated to 550° C. to provide a flat and rectangular compacted stranded cable precursor 0.4 mm thick and 3.5 mm wide. The cable precursor was subjected 50 hours to diffusion heat treatment at 680° C., forming a 3-micron thick superconducting compound of $Nb_3Sn$ in an interface between the Cu-Sn alloy matrix and Nb cores in each strand. In this case, the ratio of the minor axis to the major axis of the cross section of the superconducting compound core was 1:1.7. The top and bottom sides of the cable were coated with a 20-micron thick copper foil with indium used as a soldering agent. A polyimide insulating tape 10 microns thick and 4 mm wide was helically wound about the outside of said copper foil. The assembly was cut up in lengths of 50 mm to provide samples. Measurement was made of the critical current value of the respective samples with the various operative direction of an external magnetic field (applied at a temperature of 4.2° K. and a magnetic field of 50 kG) varied relative to the width plane of said samples. The results of measurement proved that the samples indicated critical current values falling within the range of 1580±10 amperes and were from current anisotropy.

CONTROL 1

The composite consiting of fifteen Nb core rods and Cu-Sn alloy matrix billet as in Example 5 was hot-extruded to be reduced to an outer diameter of 10 mm and later drawn and annealed at 650° C., a higher level than 580° C. at which Nb could be recrystallized. A fine multicored strand type superconducting compound cable was manufacure in the same manner as in Example 2 in other respects. The ratio of the minor axis of the cross section of the superconducting compound core to the major axis thereof was 1:11.5.

When measured in the same manner as in Example 5, the cable manufactured as described above indicated such large current anisotropy that the cable had a critical current value of 1050 amperes relative to a magnetic field applying in a direction parallel with the flat plane of the cable, but a critical current value of 1590 amperes relative to a mangetic field applying in a direction vertical to said flat plane.

EXAMPLE 6

Seven copper rods 11 were inserted, as shown in FIG. 17B, into random-arranged holes (as observed in a lotus root) bored through a tantalum rod 10. The outside of the tantalum rod 10 was coated with a silver tube 32, providing a composite rod block 21 mm in outer diameter. Thirty vanadium (hereinafter referred to as "V") rods 7, three mm in diameter were in a spaced manner set upright about said composite rod. A molten Cu-Ga alloy containing 18% by weight of gallium was poured into interspaces lying between said V rods 7 to provide composite billet body 45 mm in outer diameter.

The composite billet was formed into a hexagonal rod measuring 4 mm on each side and 80 mm in length by means of extrusion and drawing. Sixty-one of said hexagonal rods were inserted into a Cu-Ga alloy tube containing 10% by weight of gallium which measured 45 mm in outer diameter, 39 mm in inner diameter and 85 mm in length. The assembly was drawn to have its outer diameter reduced to 0.3 mm. The wire thus obtained was twisted at a pitch of 10 mm to provide a strand 9. Fifteen strands 9 thus obtained were stranded at a pitch of 20 mm to provide a hollow assembly of strands. The hollow assembly was rolled by a Turk's head roll forming a flat and rectangular shaped stranded cable precursor having a cross section of 0.25 mm×4.1 mm as shown in FIG. 22 (only nine strands are shown for briefness). At this time, a strand-packing factor indicated 95%. The cable precursor was heat-treated 50 hours at 625° C. in a vacuum furnace evacuated to $1\times10^{-4}$ mmHg, forming a superconducting compound of $V_3Ga$ in an interface between vanadium cores and a copper-gallium alloy matrix, in each strand.

When the cross section of the above-mentioned cable was observed by an optical microscopy, the tantalum barrier in the strand had a uniform thickness and cleavage of sheath was not observed in the strand. This event was supposed to result from reinforcement of a soft stabilizing material and the stress relaxation action of a silver layer coated on the outside of the tantalum tube. A prior art reaction system and formation of a superconducting compound of $V_3Ga$ in which no silver was present at the proper place consumed 75 hours in completing the required reaction. In contrast, the reaction system of this invention in which silver present at the proper place takes part consumes only 50 hours for completion of said reaction. This event is supposed for the reason that diffusion reaction was promoted through the catalytic action of silver on the reaction system. Further, the stabilizing metal was measured to have substantially the same resistance as the specific resistance of copper before used in a composite strand, proving that though a tantalum barrier had as thin a wall as 1 micron, yet no mutualdiffusion occurred to such an extent as contaminated the stabilizing metal.

EXAMPLE 7

Seventeen pure niobium rods were embedded in a copper-tin alloy containing 10% by weight of tin. The billet was drawn into a wire 0.3 mm in outer diameter. The wire was twisted at a pitch of 10 mm, providing a strand. Fifteen of said strands were stranded together at a pitch of 20 mm to form a hollow assembly of strands. The hollow assembly was rolled by a Turk's head roll providing a compacted stranded cable precursor I having a cross section of 0.25 mm×4.1 mm. One of such cable precursors which had a certain length was against set on a stranding device to remove one of the strands constituting the assembly of strands by unwinding. The emptied groove was filled with a copper ribbon 0.12 mm×0.55 mm in cross section whose surface was coated with a cuprous oxide film about 2 microns thick, forming a compacted stranded cable precursor II 0.25 mm×4.1 mm in cross section. One of said cable precursors II was again set on a stranding device to remove one of the strands other than the copper ribbon. The emptied groove was filled with a tungsten ribbon 0.12 mm×0.55 mm in cross section. The assembly was lightly compacted by a Turk's head roll, forming a compacted stranded cable precursor III 0.25 mm×4.1 mm in cross section. Each of these cable precursors I, II, III was heated 40 hours at 680° C. in a vacuum furnace evacuated to $3\times10^{-4}$ mmHg, forming a superconducting compoound of $Nb_3Sn$ in an interface between the niobium cores and the matrix of the copper-tin alloy matrix in each strand.

Current was introduced at a temperature of 4.2° K. and a magnetic field of 70 kG through one group of said cables which was impregnated with indium and another group thereof which was not impregnated with indium. Measurement was made of current value $I_C$ at which said cables were changed into to a state of normal conductivity. With the impregnated group of the cables, the samples I, II, III indicated critical current values $I_{C(I)}$ of 920 amperes, $I_{C(II)}$ of 870 amperes and $I_{C(III)}$ of 797 amperes, proving that the superconducting compounds of all these sample cables had an equal critical current density ($J_c$ A/cm$^2$). With another nonimpregnated group, the samples I, II, III showed critical current values $I_{C(I)}$ of 870 amperes $I_{C(II)}$ of 858 amperes and $I_{C(III)}$ of 797 amperes respectively. In the latter group, however the sample I was burnt out while being changed into a state of normal conductivity after introducing current once therethrough, proving that the samples II, III were fully qualified for stability.

Further, measurement was made of the current values of the above-mentioned impregnated samples I, II, III which were bent under some load into a circular form with a diameter of 30 mm. There are shown in FIG. 34 the measured loaded critical current values $I_{C(W)}$ divided by the nonloaded critical current values $I_{C(O)}$ as the standard. The results proved that under load, the sample II showed the lowest critical current value and the sample III indicated the highest critical current value, namely, the best quality of said sample III could be ascribed to the application a tungsten reinforcing material.

EXAMPLE 8

2310 pure vanadium rods and one tantalum-sheathed OFHC copper rod were embedded in a copper-gallium alloy containing 19% by weight of gallium. The composite billet was repeatedly annealed at 500° C., drawn to 0.5 mm in diameter to provide a strand. Separately, there was provided a reinforcing compacted stranded wire having stainless steel strand with a cross section of 0.06 mm×2.5 mm as shown in FIG. 4. Further, a reinforcing compacted stranded wire was provided by seting a mandrel 30 (FIG. 27) on a hollow strand assembling device (FIG. 18). Seven of the above-mentioned vanadium cored strands were stranded together at a pitch of 25 mm about the mandrel 30 (FIG. 27) bored with a rectangular hole 29 measuring 1×4 mm. In this case, the aforesaid reinforcing wire was introduced through said rectangular hole 29. The assembly was rolled by a Turk's head roll to provide a flat and rectangular stranded cable precursor 0.25 mm×5.1 mm in cross section. The cable precursor was heated 50 hours at 650° C. in a vacuum furnace evacuated to $1\times10^{-4}$ mmHg, forming a superconducting compound of $V_3Ga$ in an interface between the vanadium cores and copper-gallium alloy matrix in each strand.

Separately, a nonreinforced superconducting compound cable was formed with the same cross section of 0.25 mm×5.1 mm by another process according to this invention by way of comparison therewith. Both cables had the void spaces filled with indium, and bent flatwise and edgewise. When current was introduced therethrough at a temperature of 4.2° K. and a magnetic field of 70 kG, the two cables presented little difference, proving that if manufactured by the method of this invention, any cable was assured of sufficient flexibility both flatwise and edgewise, whether reinforced or not.

EXAMPLE 9

Seventeen pure niobium rods were embedded in a copper-tin alloy billet containing 10% by weight of tin. The composite billet was repeatedly annealed at 550° C., and drawn to a wire with an outer diameter of 0.3 mm. The wire was twisted at a pitch of 10 mm to provide a strand. Fifteen of said strands were drawn through a die 22 along the mandrel 27 (FIG. 23), providing a hollow assembly of strands 20b stranded at a pitch of 20 mm. The hollow assembly was rolled by a Turk's head roll (two directions roll), providing a trapezoidal or key stone shaped stranded cable precursor 0.37 mm×3.5 mm×0.43 mm in cross section corresponding to the one as shown in FIG. 4C. 200-meter length of said cable precursor was bundled into a coil, 20 cm in diameter. The bundle was heat treated at 680° in a furnace while the degree of vacuum was changed as shown in FIG. 35. Evacuation was commenced at point A to maintain the internal pressure of the furnace at about 1 mmHg. One hour later, when the pressure was increased to the atmospheric level, the cable precursor was removed from the furnace and rolled by a Turk's head roll to have the cross-sectional area reduced to about 30% of the original, namely, to 0.21 mm×4.1 mm×0.29 mm. The cable precursor thus reduced in cross section was again placed in the furnace and kept therein 30 hours from point B to point C with the internal pressure of the furnace decreased to about 1 mmHg. The cable was further left intact about one hour from point C to point E in the furnace was evacuation elevated to $3\times10^{-5}$ mmHg. The above-mentioned heat treatment was brought to an end at point E. When part of the heat-treated cable was cut off to unwind the stranded strands contained therein, no mutualdiffusion was found to take place between the respective strands, enabling them to be easily separated.

For comparison with the superconducting compound cable of this invention, there was provided a control cable having the same cross section of 0.21 mm×4.1 mm×0.29 mm which had been subjected to diffusion heat treatment through the operation conducted along the points A, B, D and E in FIG. 35. The control cable thus heat treated was cut off to try to unwind the stranded strands contained therein. However, the respective strands were bonded together due to mutualdiffusion and failed to be separated from each other.

Where both present and control cables were bent with a bending radius of 13 mm after the void spaces were filled with indium, and current was introduced through said cables at a temperature of 4.2° K. and a magnetic field of 70 kG, then the present cable was changed into a state of normal conductivity at 920 amperes, whereas the control cable was changed into a state of normal conductivity at 238 amperes. The reason is that since the strands of the control cable were fused and bonded together due to mutualdiffusion, the allowable bending radius over which did not deteriorate the essential property of a superconducting compound was unavoidably enlarged. The theoreical allowable bending radius was 9.5 mm for the present cable, but 19.9 mm for the control cable.

EXAMPLE 10

Seventeen pure niobium rods were embedded in a copper-tin alloy billet containing 10% by weight of tin. The composite billet was drawn to a wire with an outer diameter of 0.3 mm. The wire was twisted at a pitch of 10 mm to provide a strand. Fifteen of said strands were stranded together at a pitch of 20 mm, forming a hollow assembly of strands. The hollow assembly was rolled by a Turk's head roll providing a flat and rectangular stranded cable precursor having a cross section of 0.25 mm×4.1 mm. The cable precursor was heated 40 hours at 680° C. in a vacuum furnace evacuated to $10^{-4}$ mmHg, forming a superconducting compound of $Nb_3Sn$ in an interface between the niobium cores and the copper-tin alloy matrix in each strand. (The cable thus formed is referred to as "a cable I (12)" as shown in FIG. 33D). Further, there was provided a wire composed of 3025 niobium cores embedded in a copper-tin alloy matrix containing 10% by weight of tin. The wire was twisted at a pitch of 20 mm, and roll-shaped to a multicored tape having a cross section of 2 mm×4.1 mm. Diffusion heat treatment was carried out through the previously described conditions, forming a $Nb_3Sn$ superconducting compound (This case is referred to as a cable II (321) as shown in FIG. 33D). Further, there were provided a vanadium sleeve 2.3 mm×4.2 mm×30 mm in inner dimensions and 3.3 mm×5.2 mm×30 mm in outer dimensions and seven vanadium rods 1.3 mm in diameter. The provided sleeve and rods were dipped in a bath of molten gallium at about 300° C. After taken out of the bath, the sleeve and rods were heated 5 minutes at 900° C., forming a $V_3Ga$ layer about 10 microns thick on the surface of the vanadium sleeve and vanadium rods. The sleeve and rods were plated with gallium with a thickness of 50 microns.

The end portions to be jointed of the cables I (12) and II (321) were dipped 1 minute in an aqueous solution of nitric acid to remove part of the copper-tin alloy matrix. Both cables I (12), II (321) were inserted into the V-$V_3$Ga-Ga composite sleeve in a state overlapped on each other for a distance of 30 mm. The upper and lower sides were bored with through holes 1.5 mm in diameter. The V-$V_3$Ga-Ga composite rods were inserted into said holes. The assembly was tightened at pressure of 8 kg/mm$^2$, and heated 20 minutes in an inert gas at about 800° C., and later droped to room temperature at the rate of 5°, C./min. The joint portion of the above-mentioned cables I (12), II (321) was cooled to 4.2° K. Measurement was made of the electric resistance of the jointed cables I (12), II (321) by introducing current of 0.2 ampere therethrough. The measured resistance indicated a smaller value than $10^{-15}$ $\Omega$cm, in terms of specific resistance. When the cross section of the joint portion was analyzed by an X-ray microanalyzer, the superconducting compound was detected to contain not only $Nb_3Sn$ and $V_3Ga$ but also a substance corresponding to a solid solution of $Nb_3Sn_{0.8}-Ga_{0.2}$ obtained from Ga and $Nb_3Sn$. The interfaces of these materials were bound crystallographically, and were substantially free from void spaces, pinholes, oxides, etc.

What we claim is:

1. A superconducting compound cable, comprising a plurality of strands, at least one of said strands containing at least one filament of a brittle superconducting compound material extending longitudinally along the strand, each of said strands having two cross sectional dimensions transverse to the direction of the strand and transverse to each other, said strands being arranged in layers and stranded at a predetermined pitch in the axial direction of the cable, the total cross sectional area of all the strands of the cable accounting for more than 50 percent of that of a quadrilateral circumscribed about the periphery of the cross section of the cable, the stranding pitch P of the cable being in the range of 2 to 20 times the width W of the cable, the ratio of the width of the cable to the thickness $t_0$ of the cable being in the range of 1 to 100, and the cable being constructed with the following relationship:

$$t_0 = 2R_0 \times \epsilon_0 \times (1 + rW^2/P^2)$$

where $R_0$ is the allowable bending radius of the cable which is a radius of curvature of the cable measured from the center of the curvature to a neutral interface of the cable, and $\epsilon_0$ is the upper strain limit of the superconducting compound material within which the superconducting compound material does not degrade in superconducting characteristics.

2. A cable as in 1, wherein at least one of said strands includes a stabilizing metal or a reinforcing material or both.

3. A cable as in claim 1, wherein one of said strands includes a stabilizing metal and a reinforcing material.

4. A cable as in claim 1, wherein one of said cross sectional dimensions is greater than the other.

5. A cable as in claim 1, wherein the superconducting compound is selected from the group $Nb_3Sn$ and $V_3Ga$.

6. A superconducting compound cable, comprising a plurality of strands, at least one of said strands containing at least one filament of a brittle superconducting compound material extending longitudinally along the strand, said strands being arranged in layers and stranded at a stranding pitch P in the range of 2 to 20 times the width W of the cable in the axial direction of the cable, the ratio of the width of the cable to the thickness $t_0$ of the cable being in the range of 1 to 100, the cable being constructed with the following relationship:

$$t_0 = 2R_0 \times \epsilon_0 \times (1 + 4w^2/P^2)$$

where $R_0$ is the allowable bending radius of the cable which is a radius of curvature of the cable measured from the center of the curvature to a neutral interface of the cable, and $\epsilon_0$ is the upper strain limit of the superconducting compound material within which limit the superconducting compound material does not degrade in superconducting characteristics and the total cross sectional area of all the strands of the cable accounting for more than 50 percent of that of a quadrilateral circumscribed about the periphery of the cross section of the cable.

7. A superconducting compound cable according to claim 6 wherein said cable includes strands containing a stabilizing metal selected from the group consisting of copper, gold, silver and aluminium.

8. A superconducting compound cable according to claim 6 wherein the ratio of the minor axis of the cross section of a superconducting compound material included in the strand to the major axis thereof ranges between 1 and 0.5.

9. A superconducting compound cable according to claim 6 wherein part or the whole of the cable is embedded in either or both of a stabilizing metal and a reinforcing material.

10. A superconducting cable according to claim 6 wherein a reinforcing material is interposed between strands arranged in layers.

11. A superconducting compound cable according to claim 6 wherein one or both surfaces of the wide side of the cable are provided with one or more kinds of a stabilizing metal, reinforcing material and electric insulating material.

12. A superconducting compound cable according to claim 6 wherein a soft metal or electric insulating material is filled in void spaces lying between the strands or is mounted on the exposed portions thereof.

13. A superconducting compound cable according to claim 6 wherein the strands are coated with a material of high electric resistance or electric insulation.

14. A superconducting compound cable according to claim 6 wherein the outer most surface of the cable is surrounded by one or more kinds of an electrically insulated stabilizing metal, electrically insulated reinforcing material and electric insulating material by stranding, braiding or lapping.

15. A superconducting compound cable according to claim 6 which is adapted to have a large current capacity by being twisted together in a desired number in the form of secondary strands.

* * * * *

UNITED STATES PATENT OFFICE
CERTIFICATE OF CORRECTION

Patent No. 4,329,539            Dated May 11, 1982

Inventor(s) Yasuzo Tanaka and Yoshio Furuto

It is certified that error appears in the above-identified patent and that said Letters Patent are hereby corrected as shown below:

Please add the following to section [30] Foreign Application Priority Data:

--May 17, 1976 [JP] Japan .................56370

May 18, 1976 [JP] Japan .................56986 --

Column 2, line 59, change "$t_0 2R_0 \times \varepsilon_0 \times (1+4W^2/P^2)$" to -- $t_0 = 2R_0 \times \varepsilon_0 \times (1+4W^2/P^2)$ --.

Column 33, line 54, (Claim 1) change "$t_0 = 2R_0 \times \varepsilon_0 \times (1+rW^2/P^2)$" to -- $t_0 = 2R_0 \times \varepsilon_0 \times (1+4W^2/P^2)$ --.

Signed and Sealed this

Thirty-first Day of May 1983

[SEAL]

Attest:

DONALD J. QUIGG

Attesting Officer    Acting Commissioner of Patents and Trademarks